US012706155B2

(12) United States Patent
Zhao et al.

(10) Patent No.: US 12,706,155 B2
(45) Date of Patent: Aug. 11, 2026

(54) PRE-CHARGE UNSELECTED BLOCK WORD LINE BEFORE PROGRAM

(71) Applicant: Sandisk Technologies, Inc., Milpitas, CA (US)

(72) Inventors: Qinghua Zhao, San Carlos, CA (US); Mohan Vamsi Dunga, Santa Clara, CA (US); Gwang Yeong Stanley Jeong, Dublin, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 136 days.

(21) Appl. No.: 18/894,270

(22) Filed: Sep. 24, 2024

(65) Prior Publication Data

US 2026/0088092 A1 Mar. 26, 2026

(51) Int. Cl.
*G11C 16/10* (2006.01)
*G11C 16/04* (2006.01)
*G11C 16/08* (2006.01)

(52) U.S. Cl.
CPC ........ *G11C 16/102* (2013.01); *G11C 16/0483* (2013.01); *G11C 16/08* (2013.01)

(58) Field of Classification Search
CPC .................................................... G11C 16/102
See application file for complete search history.

(56) References Cited

U.S. PATENT DOCUMENTS

| | | | | |
|---|---|---|---|---|
| 7,573,752 B2 | 8/2009 | Aritome | | |
| 7,684,268 B2 | 3/2010 | Park et al. | | |
| 7,876,618 B2 | 1/2011 | Lee et al. | | |
| 10,658,044 B2 | 5/2020 | Lee | | |
| 11,688,470 B2 | 6/2023 | Yip | | |
| 2007/0030737 A1* | 2/2007 | Aritome | G11C 16/0483 | 365/185.11 |
| 2022/0059175 A1* | 2/2022 | Suzuki | G11C 16/10 | |
| 2023/0064180 A1* | 3/2023 | Toyonaga | H10B 43/50 | |

* cited by examiner

*Primary Examiner* — Hoai V Ho
(74) *Attorney, Agent, or Firm* — Pearl Cohen LLP

(57) ABSTRACT

Technology for operating word line switch (WLSW) transistors that are configured to provide voltages to word lines in non-volatile storage such as NAND. Each WLSW transistor has a source terminal that may be connected to a word line in order to provide an operating voltage to that word line. In an aspect, voltages are applied to a WLSW transistor to charge an unselected word line in an unselected block to a pre-charge voltage during a program operation of a selected word line in a selected block. This pre-charge voltage may remain on the source terminal of the WLSW transistor that is connected to the unselected word line while a neighboring WLSW transistor provides a program voltage to the selected word line in the selected block. Therefore, the voltage difference between the source terminals of the neighboring WLSW transistors is reduced, which reduces leakage current between these two WLSW transistors.

20 Claims, 22 Drawing Sheets

Storage System 100
Memory Controller 120
130
Storage
160
Memory Interface
158
ECC Engine
156
Processor
154
NOC
164
Local Memory Controller
140
Local Memory
152
Host Interface
102
Host 207
211
208
201
System Control Logic 260
State Machine 262
Storage 266
Power Control 264
Interface 268
row address signals
control signals
row decoder 222
array drivers 224
block select 226
row control circuitry 220
control signals
column address signals
column control circuitry 210
column decoder 212
driver circuitry 214
block select 216
R/W Circuits 225
206
memory structure 202
Control Die
Memory Controller To NAND strings
BL3
BL2
BL1
BL0
225
225
225
225
325
Comparison circuit 320
Sense Node Latch 322
Managing Circuit 330
340
ADL
BDL
CDL
346
336
352
348
XDL
I/O Interface 332
334
Data 700
(selected block)
BLs
SGD
WLDD
WL111
WL0
WLDS
SGS
720
(unselected block)
WI111
BD
702
703
704
706
708
710
712
714
722
723
724
726
728
730
732
734
BLs, 742
Page Buffer, 740
Column Decoder, 744
PB DRV, 774
HV GEN, 772
CONTROL, 780
CMD REG, 776
I/O, 778
ADD REG, 770
750
SGD DRV, 752
WLDD DRV, 754
WL31 DRV, 756
WL0 DRV, 758
WLDS DRV, 760
SGS DRV, 762
TT DRV, 764

1002-3
V_pchg
D
1006-2
Vss
Gate
S
(Vss)
To selected WL in selected block 1002-5
(V_pchg)
S
To unselected WL in unselected block
V_pchg + Vt
1006-3
V_pchg
D
1002-3
V_pgm
D
1006-2
V_pgm + vt
Gate
S
(Vpgm)
To selected WL in selected block 1002-5
(V_pchg)
S
To unselected WL in unselected block
Vss
1006-3
V_pgm
D

1300

Precharge WL in unselected Block (having neighbor WLSW)

Discharge CG (select target BLK)

Program

BLKSELn (sel BLK) Vss

BLKSEL (sel BLK) Vss VPGPH (1st loop)

BLKSELn (neighbor WLSW) Vss VRD

BLKSEL (WLSW) VPGPH (1st loop) Vss

BLKSELn (other usel BLK) VRD

BLKSEL (other usel BLK) Vss

CG V_pchg Viso Vpass Vpgm

SGD Vss Selected SB Unelected SBs

USGD Vss

PRE-CHARGE UNSELECTED BLOCK WORD LINE BEFORE PROGRAM

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. Herein, a memory system that uses non-volatile memory for storage may be referred to as a storage system. The memory structure may be three-dimensional (3D). One type of 3D structure has non-volatile memory cells arranged as vertical NAND strings. The 3D memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the physical block. The memory system may have a large number of blocks, with each block containing NAND strings and associated word lines. Each block could have over one hundred word lines and there may be thousands of blocks. Therefore, there may be a very large number of word lines in the memory system.

The memory system typically has transistors that provide the voltages to the word lines, as well as other control lines in the memory structure. For example, row decoder circuitry may contain word line switch transistors that provide operating voltages to the word lines. In some architectures, there is a word line switch transistor for each word line in the memory structure. Due to the very large number of word lines that are typically present in memory systems such as NAND the row decoders have a very large number of word line switch transistors. Therefore, the word line switch transistors may occupy a very large amount of chip (i.e., semiconductor die) area.

It is desirable to reduce the chip area for circuitry such as row decoders. However, there are technical challenges associated with scaling down the area required for components such as word line switch transistors.

BRIEF DESCRIPTION OF THE DRAWINGS

Like-numbered elements refer to common components in the different figures.

DETAILED DESCRIPTION

Technology is disclosed for operating word line switch (WLSW) transistors that are configured to provide voltages to word lines in non-volatile storage such as NAND memory. Each WLSW transistor may have a source terminal that may be connected to a word line in order to provide an operating voltage to that word line. Due to the nature of the chip layout the source terminals of pairs of the WLSW transistors may be quite close to each other. Moreover, there may be a substantial difference in the voltages on these neighboring source terminals in order to provide the desired operating voltages to the associated word lines. For example, the source terminal of one WLSW transistor may be at a program voltage to provide the program voltage to a selected word line in a selected block, whereas the source terminal of a neighboring WLSW transistor may be connected to an unselected word line in an unselected block. The voltage provided to the unselected word line in the unselected block should not be too high or any data stored in the memory cells connected to that unselected word line could be disturbed. However, a leakage current could result due to the large voltage difference between the neighboring source terminals. One possible solution to keep the leakage current at a tolerable level is to design the chip such that there is a significant distance between the source terminals of neighboring WLSW transistors.

In an embodiment, the leakage current between the source terminals of neighboring WLSW transistors is reduced by pre-charging the aforementioned unselected word line in the unselected block to a pre-charge voltage during a program operation of the aforementioned selected word line in the selected block. This pre-charge voltage may remain on the source terminal of the WLSW transistor that is connected to the unselected word line while the neighboring WLSW transistor provides a program voltage to the selected word line in the selected block. Therefore, the voltage difference between the source terminals of the neighboring WLSW transistors is reduced, which reduces leakage current between these two WLSW transistors. This reduction of leakage current allows the source terminals of the neighboring WLSW transistors to be placed closer to each other. Therefore, the chip area for the WLSW transistors may be reduced.

Figure 1:
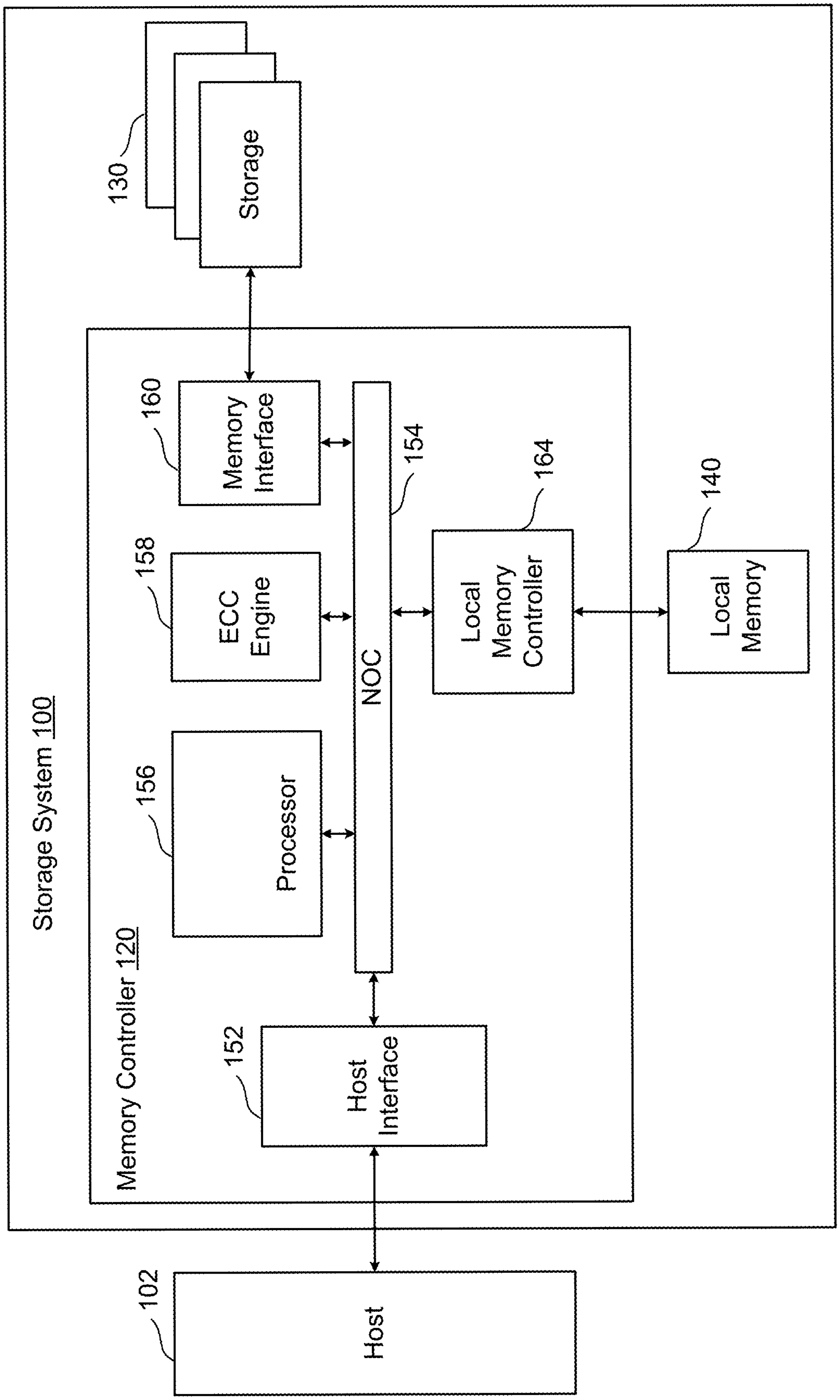
FIG. 1 is a block diagram depicting one embodiment of a memory system.

FIG. 1 is a block diagram of one embodiment of a memory system 100 that implements the technology described herein. In one embodiment, memory system 100 is a solid state drive ("SSD"). Memory system 100 can also be a memory card, USB drive or other type of memory system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations such as programming, erasing, reading, and memory management processes. In one embodiment, processor 156 is programmed by firmware. In other embodiments, processor 156 is a custom and dedicated hardware circuit without any software. Processor 156 may also implement a translation module, as a software/firmware process or as a dedicated hardware circuit. In many systems, the non-volatile memory is addressed internally to the memory system using physical addresses associated with the one or more memory die. However, the host system will use logical addresses to address the various memory locations. This enables the host to assign data to consecutive logical addresses, while the memory system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a memory system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
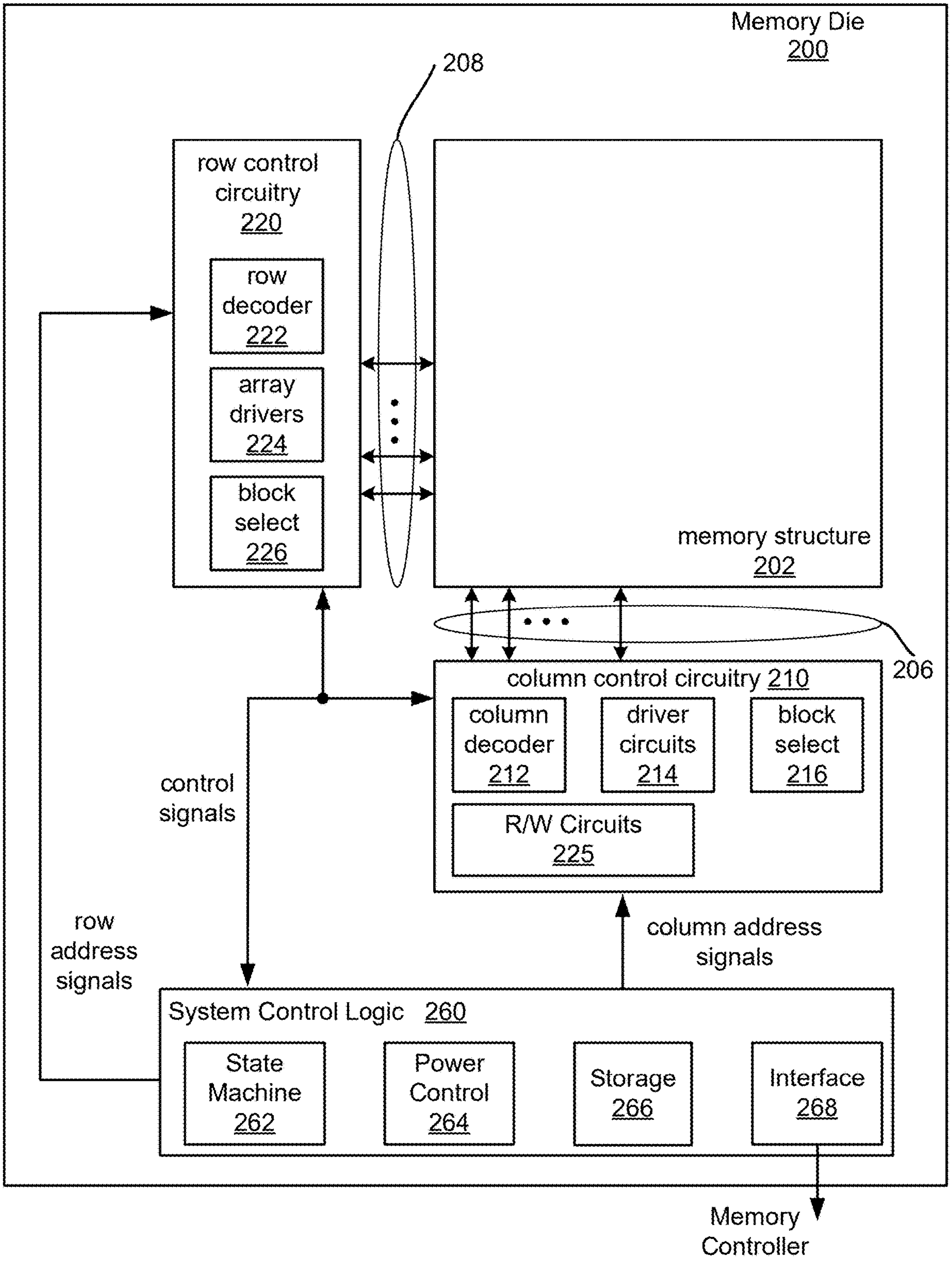
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below.

The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The system control logic 260, column control circuitry 210, and/or row control circuity 220 are configured to control memory operations such as open block reads at the die level.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of memory system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the memory system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
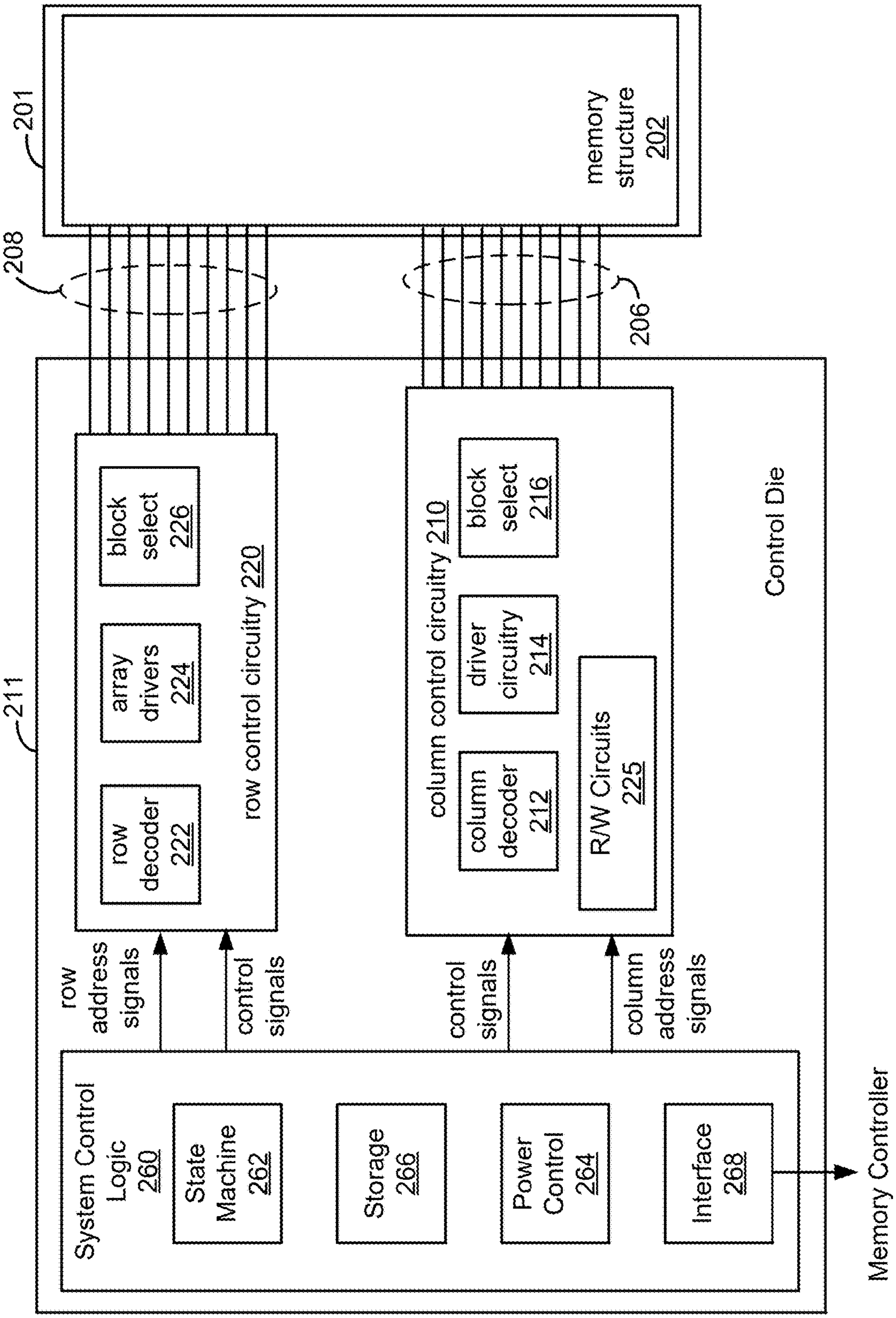
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of memory system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit. For purposes of this document, the term "apparatus" can include, but is not limited to, one or more of, memory system 100, storage 130, memory die 200, integrated memory assembly 207, and/or control die 211.

Figure 3A:
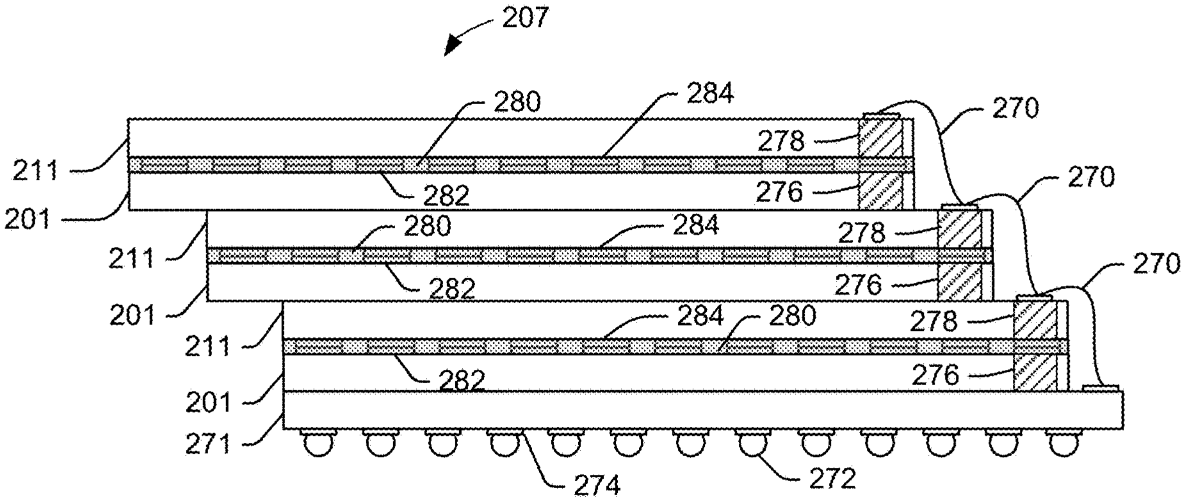
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
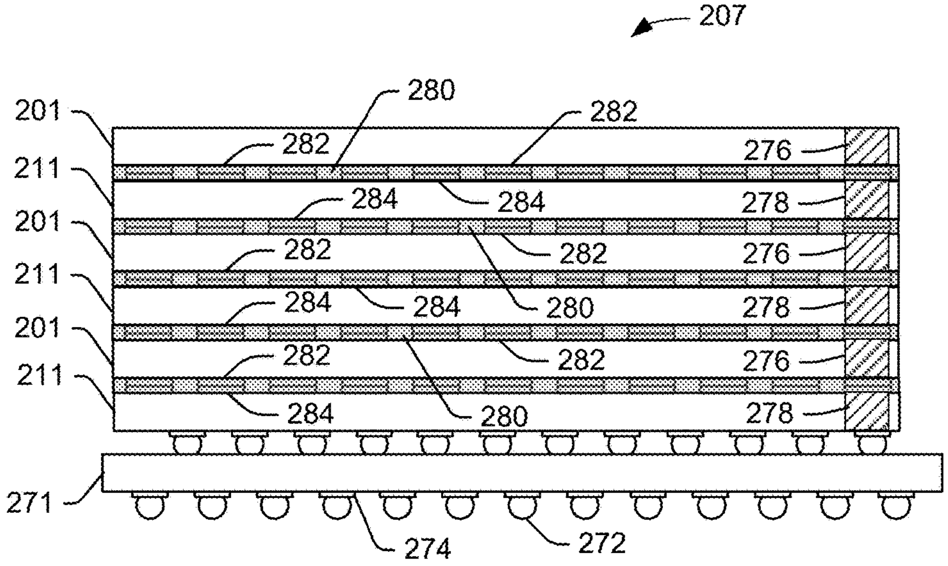

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
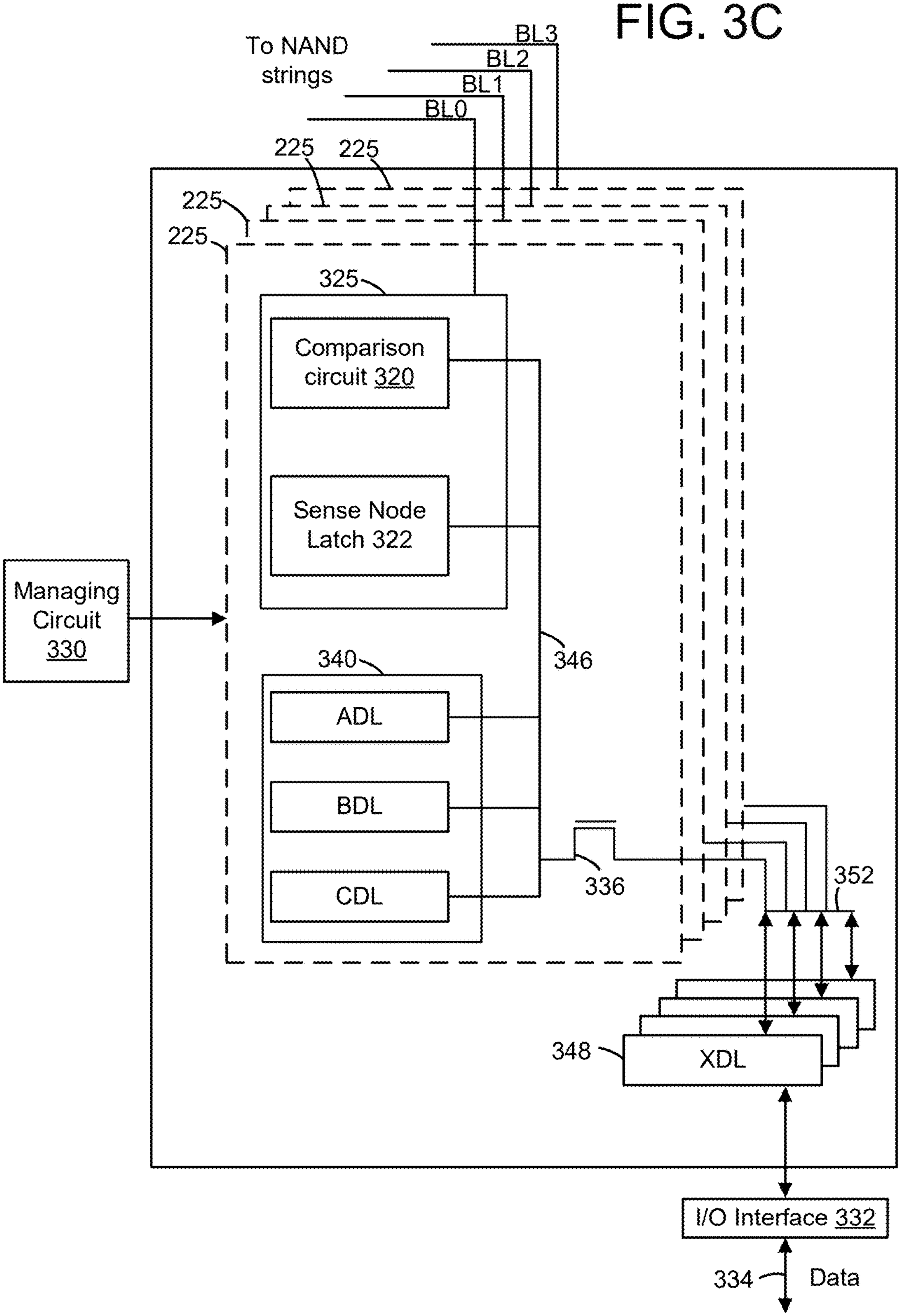
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier. The following will discuss use of the sense amplifier 325 to sense a condition (e.g., data state) of a memory cell.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the program verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
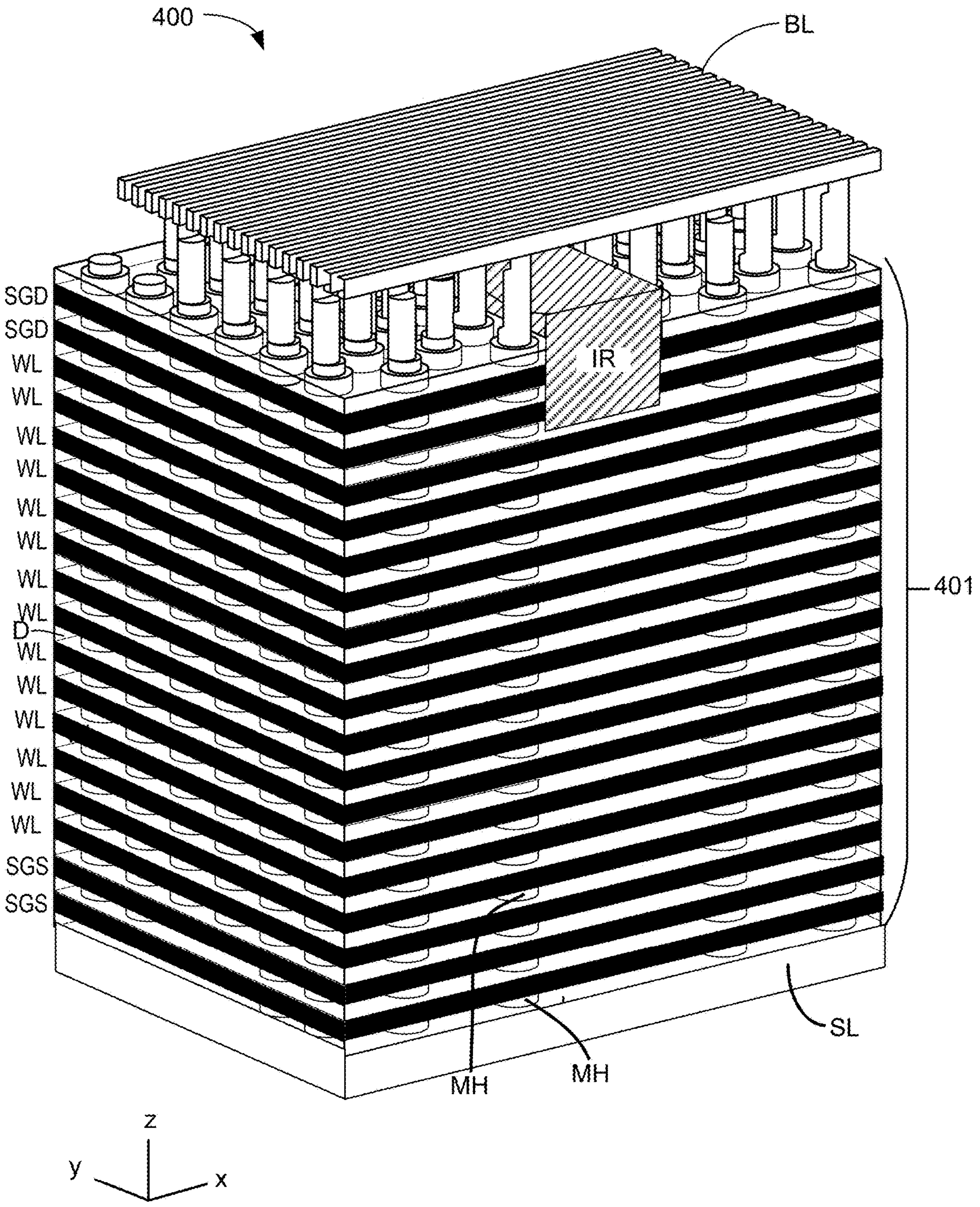
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D. The conductive layers are labeled as one of: SGD, WL, or SGS. An SGD conductive layer serves as drain side select lines. A WL conductive layer serves as a word line. An SGS conductive layer serves as a source side select line. The numbers of each of these conductive layers is limited for ease of illustration. The number of alternating dielectric layers and conductive layers can vary based on specific implementation requirements. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

In one embodiment the block is operated as a number of "sub-blocks." Each of these "sub-blocks" has many NAND strings. In an embodiment, an isolation region (IR) divides the SGD layers into multiple SGD select lines, each of which is used to select a sub-block (e.g., set of NAND strings). FIG. 4 depicts an example having one IR region and thereby two sub-blocks. However, there may be more than one IR region and thereby more than two sub-blocks. Optionally, the IR region can extend downward through all of the alternating dielectric layers and conductive layers.

Figure 4A:
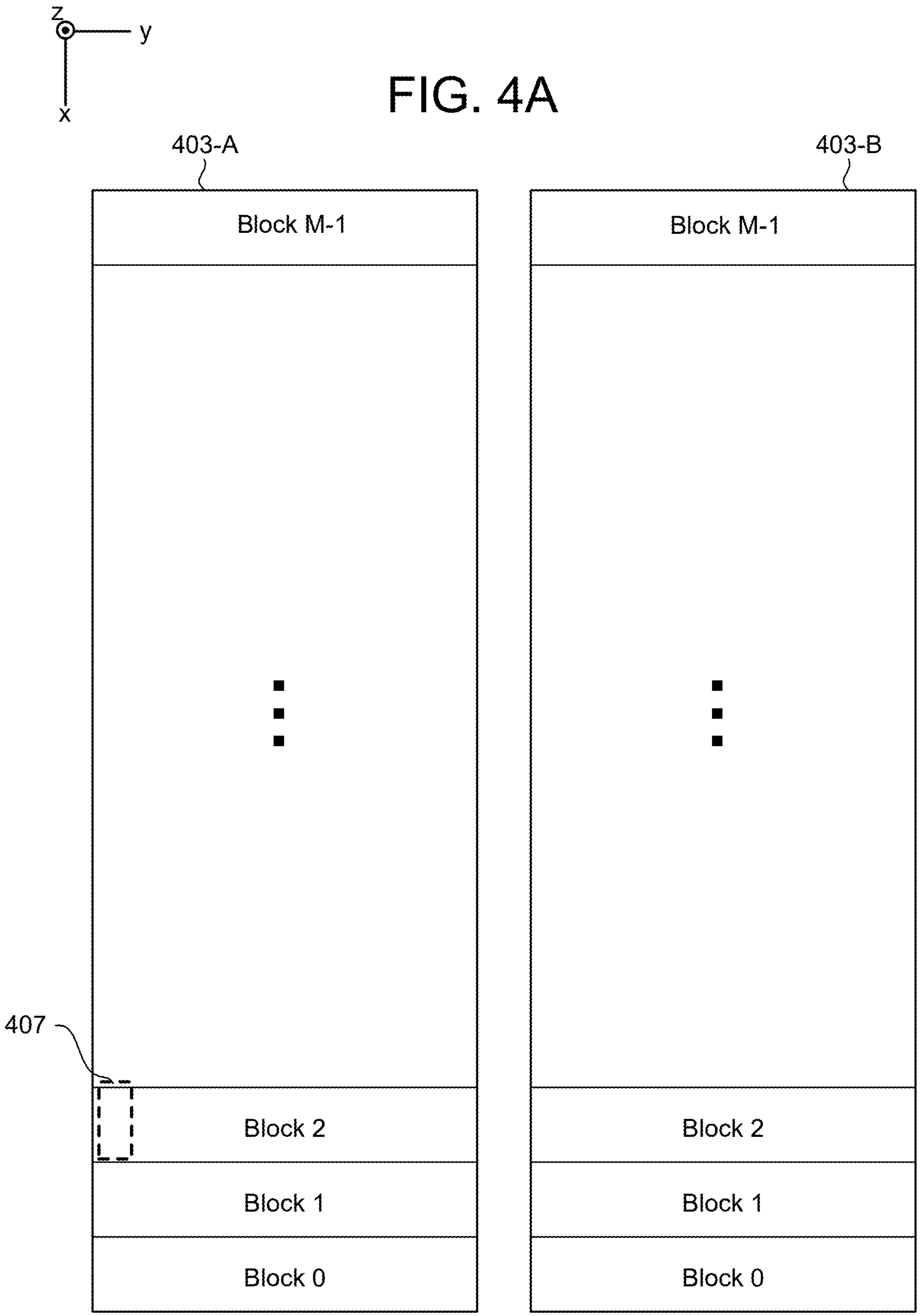
FIG. 4A is a block diagram of one embodiment of a memory structure having two planes.

FIG. 4A is a block diagram explaining one example organization of memory structure 202, which is divided into two planes 403-A and 403-B. Each plane 403 is then divided into M physical blocks. In one example, each plane has about 2000 physical blocks (or more briefly "blocks"). However, different numbers of blocks and planes can also be used. In one "full-block" embodiment, a block of memory cells is a unit of erase. That is, all memory cells of a block are erased together. In a "sub-block mode" embodiment, blocks are divided into sub-blocks and the sub-blocks are the unit of erase. In an embodiment, a block contains a number of word lines with each sub-block containing a unique set of the data word lines. In an embodiment, each plane 403-A, 403-B has a set of bit lines that extend across all of the blocks in that plane. In an embodiment, one block per plane is selected at a time. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403-A, 403-B more or fewer than two planes can be implemented. In some embodiments, memory structure 202 includes four planes. In some embodiments, memory structure 202 includes eight planes. In some embodiments, programming can be performed in parallel in a first selected block in plane 403-A and a second selected block in plane 403-B.

Figure 4B:
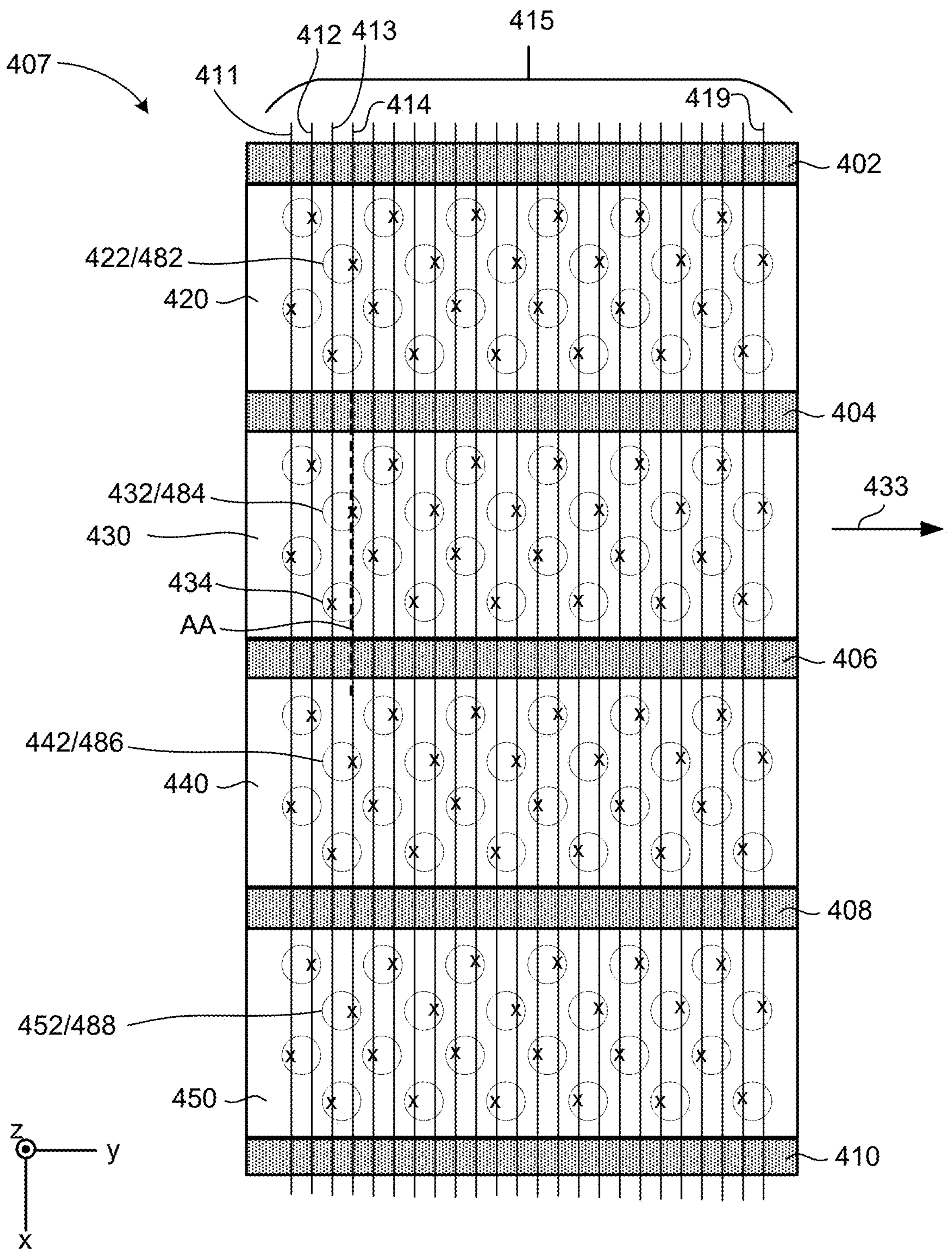
FIG. 4B is a block diagram depicting a top view of a portion of block of memory cells showing an array region.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, and 452. Vertical column 422 implements NAND string 482. Vertical column 432 implements NAND string 484. Vertical column 442 implements NAND string 486. Vertical column 452 implements NAND string 488. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, and 410, which are formed of $SiO_2$; however, other dielectric materials can also be used. Isolation regions 402, 404, 406, 408, and 410 serve to divide the top layers of the physical block into four regions; for example, the top layer depicted in FIG. 4B is divided into regions 420, 430, 440, and 450, which are referred to herein as "sub-blocks. Each sub-block contains a large number of NAND strings. In one embodiment, isolation regions 402 and 410 separate the physical block 407 from adjacent physical blocks. Thus, isolation regions 402 and 410 may extend down to the substrate. In one embodiment, the isolation regions 404, 406, and 408 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/NAND string in each of regions (sub-blocks) 420, 430, 440, and 450. In that implementation, each physical block has sixteen rows of active columns and each bit line connects to four NAND strings in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region (420, 430, 440, 450) having four rows of vertical columns, four regions (420, 430, 440, 450) and sixteen rows of vertical columns in a block, those exact numbers are an example implementation. Other embodiments may include more or fewer regions (420, 430, 440, 450) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
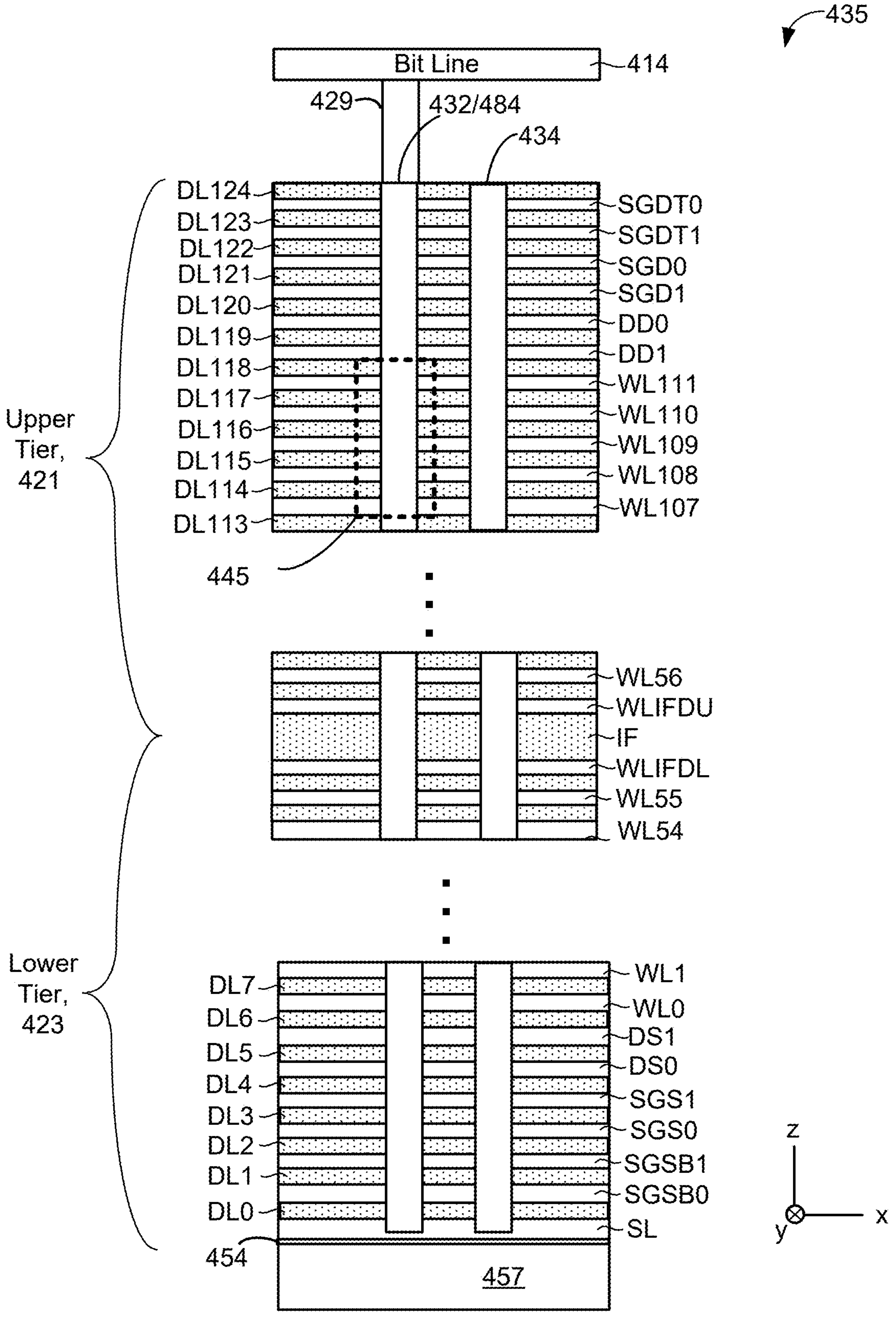
FIG. 4C depicts an example of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIDDL, DS1, and DS0 are provided, in addition to the data word line layers WL0-WL111. There may be more or fewer than 112 data word line layers and more or fewer than six dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 429 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have the same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

FIG. 4C depicts an example of a stack 435 having two tiers (lower tier 423, upper tier 421). A two tier or other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the tiers are erased independent of one another. Hence, data may be maintained in the upper tier 421 after the lower tier 423 is erased. Likewise, data may be maintained in the lower tier 423 after upper tier 421 is erased.

Figure 4D:
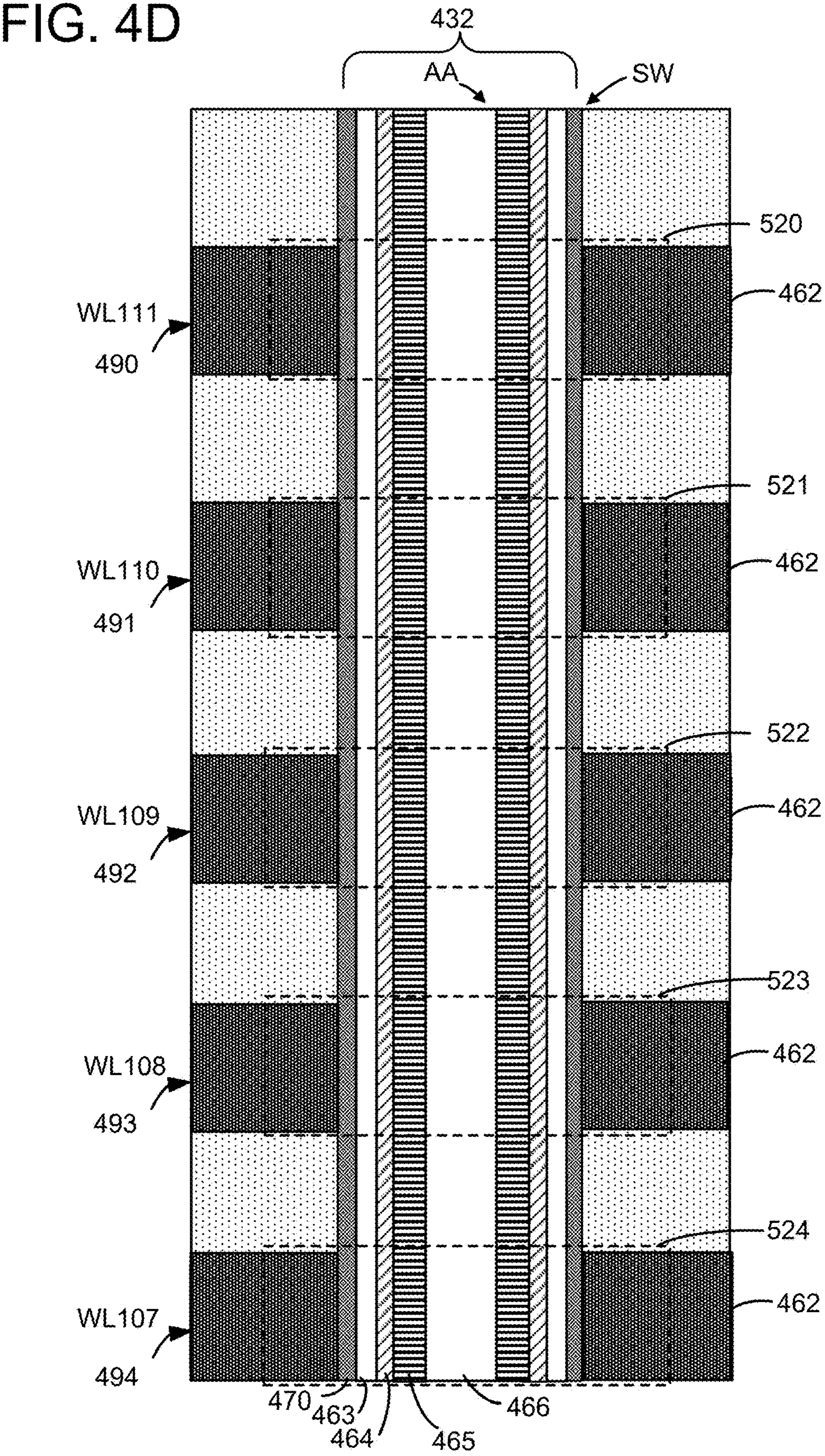
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vt of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
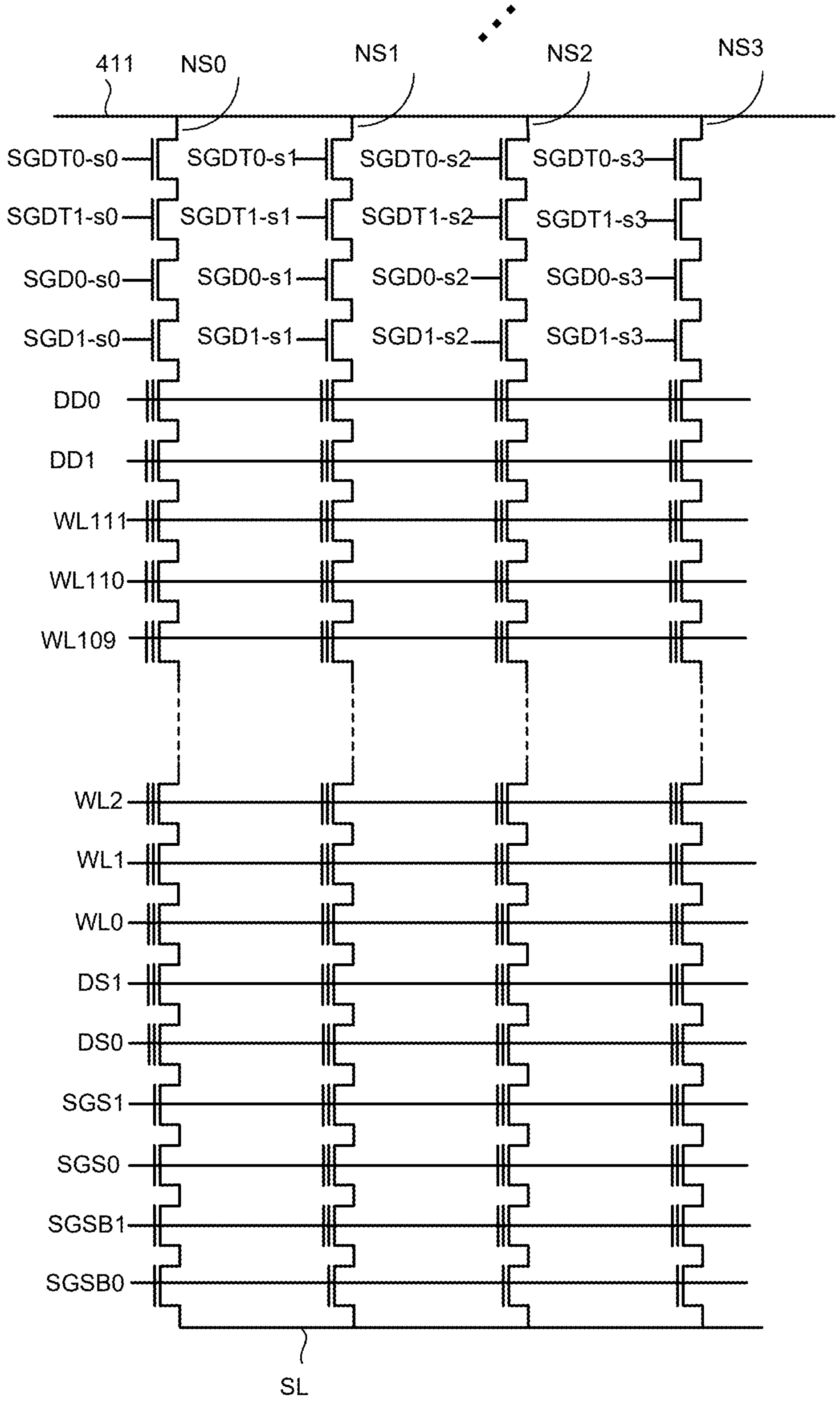
FIG. 4E is a schematic diagram of a portion of one embodiment of a block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to four NAND strings. Thus, FIG. 4E shows bit line 411 connected to NAND string NS0, NAND string NS1, NAND string NS2, and NAND string NS3.

In one embodiment, there are four sets of drain side select lines in the physical block. For example, the set of drain side select lines connected to NS0 include SGDT0-s0, SGDT1-s0, SGD0-s0, and SGD1-s0. The set of drain side select lines connected to NS1 include SGDT0-s1, SGDT1-s1, SGD0-s1, and SGD1-s1. The set of drain side select lines connected to NS2 include SGDT0-s2, SGDT1-s2, SGD0-s2, and SGD1-s2. The set of drain side select lines connected to NS3 include SGDT0-s3, SGDT1-s3, SGD0-s3, and SGD1-s3. Herein the term "SGD" may be used as a general term to refer to any one or more of the lines in a set of drain side select lines. In some embodiments, the same operating voltage is applied to SGDT0 and SGDT1. In some embodiments, the same operating voltage is applied to SGD0 and SGD1. In some erase embodiments, different operating voltage are applied to SGDT0/SGDT1 than to SGD0/SGD1. Note that SGDT0/SGDT1 are adjacent to the bit line. In some erase embodiments, a voltage applied to SGDT0/SGDT1 in combination with a bit line voltage may be used to generate a gate induced gate leakage (GIDL) current. Such a voltage applied to SGDT0/SGDT1 may be referred to herein as a GIDL voltage.

In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These four sets of drain side select lines correspond to four "sub-blocks." A first sub-block corresponds to those vertical NAND strings controlled by SGDT0-s0, SGDT1-s0, SGD0-s0, and SGD1-s0. A second sub-block corresponds to those vertical NAND strings controlled by SGDT0-s1, SGDT1-s1, SGD0-s1, and SGD1-s1. A third sub-block corresponds to those vertical NAND strings controlled by SGDT0-s2, SGDT1-s2, SGD0-s2, and SGD1-s2. A fourth sub-block corresponds to those vertical NAND strings controlled by SGDT0-s3, SGDT1-s3, SGD0-s3, and SGD1-s3. As noted, FIG. 4E only shows the NAND strings connected to bit line 411. However, a full schematic of the block would show every bit line and four vertical NAND strings connected to each bit line.

Although the example memories of FIGS. 4-4E are three dimensional memory structure that includes vertical NAND strings with charge-trapping material, other 3D memory structures can also be used with the technology described herein.

Figure 5:
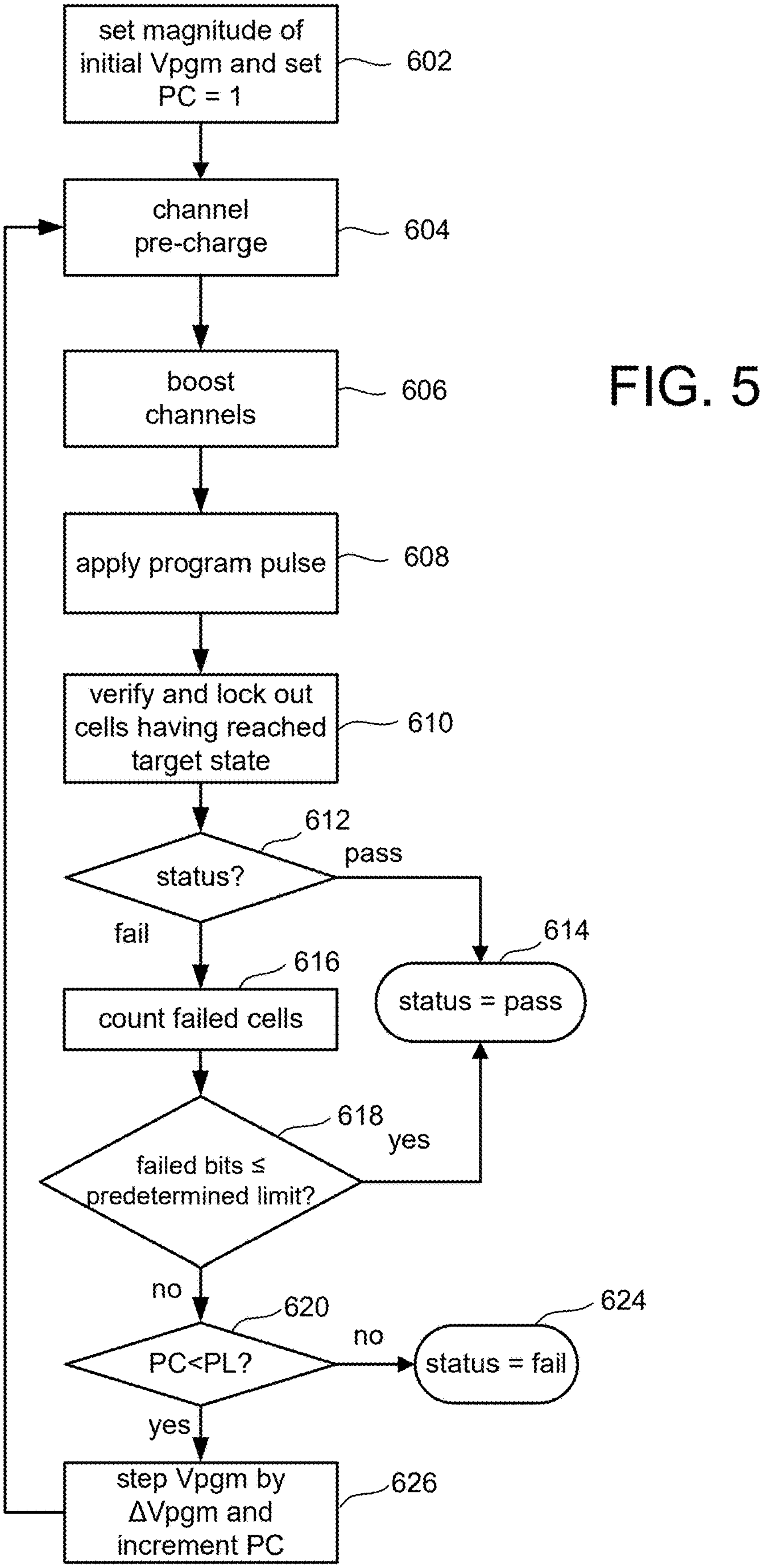
FIG. 5 is a flowchart describing one embodiment of a process for programming memory cells.

The storage systems discussed above can be erased, programmed and read. FIG. 5 is a flowchart describing one embodiment of a process for programming memory cells. For purposes of this document, the term program and programming are synonymous with write and writing. In one example embodiment, the process of FIG. 5 is performed for memory structure 202 using the one or more control circuits (e.g., system control logic 260, column control circuitry 210, row control circuitry 220) discussed above. In one example embodiment, the process of FIG. 5 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 5 is performed to implement the full sequence programming, as well as other programming schemes including multi-stage programming. When implementing multi-stage programming, the process of FIG. 5 is used to implement any/each stage of the multi-stage programming process.

Typically, the program voltage applied to the control gates (via a selected data word line) during a program operation is applied as a series of program pulses (e.g., voltage pulses). Between programming pulses a set of verify pulses (e.g., voltage pulses) may be used to perform verification. In many implementations, the magnitude of the program pulses is increased with each successive pulse by a predetermined step size. In step 602 of FIG. 5, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify reference voltage.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, then the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 5 is performed.

Figure 6A:
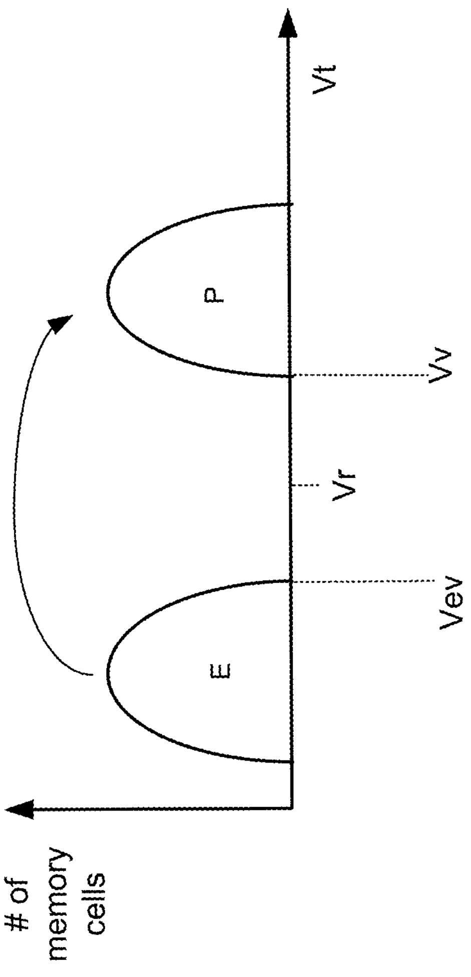
FIGS. 6A, 6B and 6C depict threshold voltage distributions.

At the end of a successful programming process, the threshold voltages of the memory cells should be within one or more distributions of threshold voltages for programmed memory cells or within a distribution of threshold voltages for erased memory cells, as appropriate. FIG. 6A a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 6A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 6A depicts read reference voltage Vr. By testing (e.g., performing one or more sense operations) whether the threshold voltage of a given memory cell is above or below Vr, the system can determine whether a memory cell is erased (state E) or programmed (state P). FIG. 6A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 6B, each memory cell stores three bits of data. Other embodiments may use other data capacities per memory cell (e.g., such as two, four, or five bits of data per memory cell).

Figure 6B:
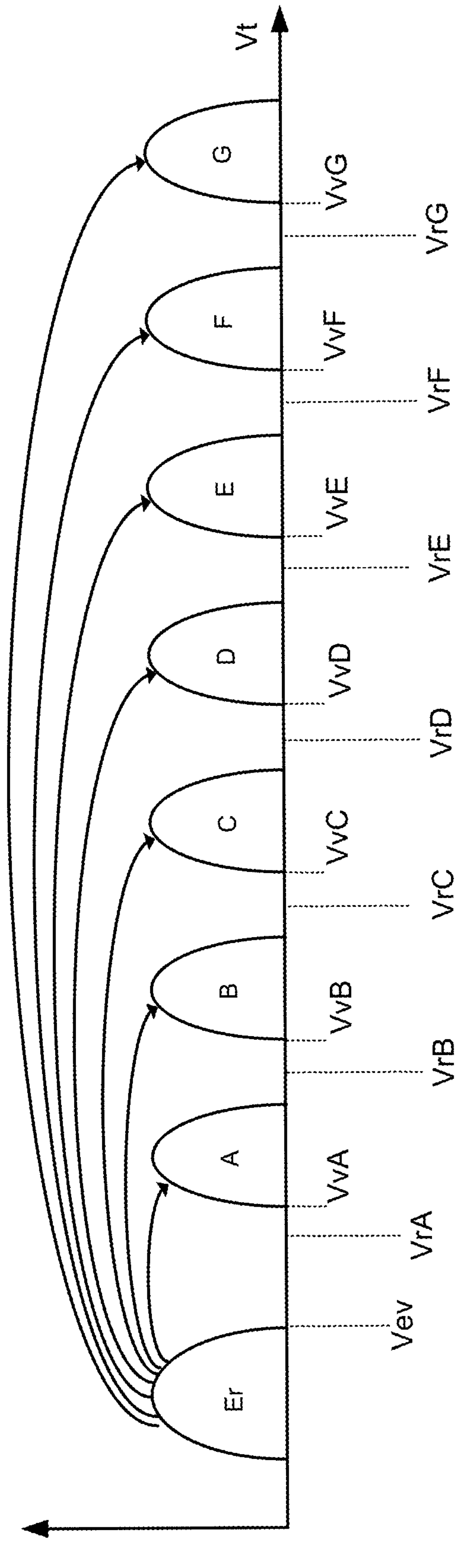

FIG. 6B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 6B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 6B also shows a number of verify reference voltages. The verify reference voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

Figure 6C:
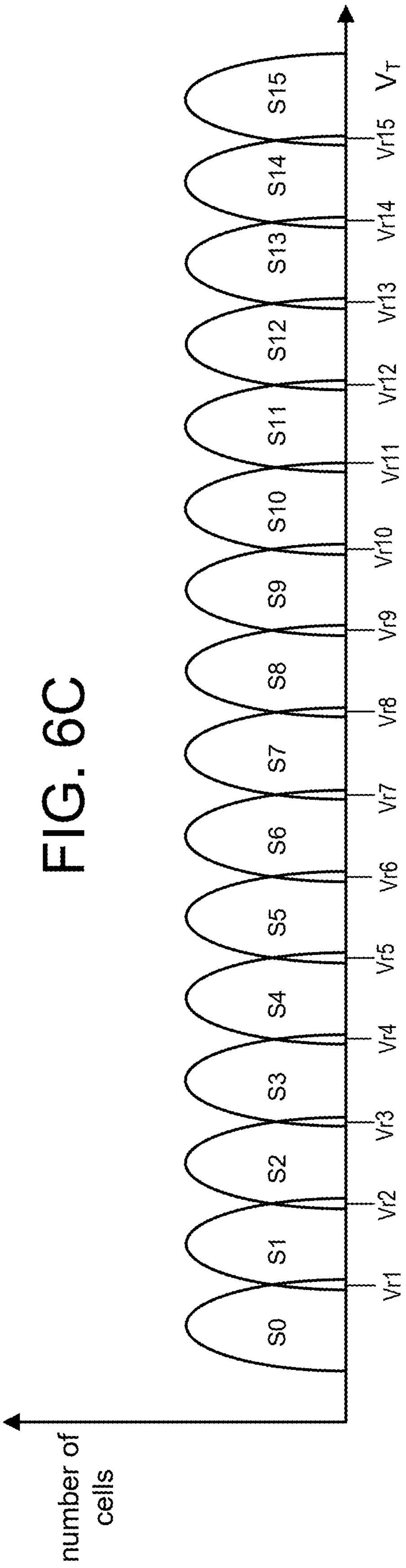

FIG. 6C illustrates example threshold voltage distributions for the memory array when each memory cell stores four bits of data. Other embodiments, however, may use other data capacities per memory cell (e.g., such as one, two, three, or five bits of data per memory cell). FIG. 6C shows 15 read reference voltages, Vr1-Vr15 for reading data from memory cells. The set of memory cells may be connected to the same word line. Each read reference level is used to distinguish between two adjacent threshold voltage distributions. Stated another way, each read reference level is used to distinguish between two adjacent data states. For example, read reference level Vr4 is used to distinguish between data states S3 and S4. Each read reference voltages Vr1-Vr15 used to distinguish between two adjacent threshold voltage distributions may be referred to herein as a "hard bit" reference voltage. By testing (e.g., performing sense operations) whether the threshold voltage of a given memory cell is above or below the 15 read reference voltages, the system can determine what data state (i.e., S0, S1, S2, S3 . . . ) a memory cell is in.

FIG. 6C depicts an example in which four bits are stored per memory cell. Thus, four pages may be stored in a set of memory cells. The set of memory cells may be connected to the same word line. These pages may be referred to as a lower page, lower-middle page, upper-middle page, and upper page. In one embodiment, in order to read the lower page, the memory cells are sensed using four different read reference voltages. For example, the memory cells may be sensed at Vr1, Vr4, Vr6, and Vr11 to read one of the pages.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 6C depicts that there may be some overlap between the data states S0-S15. The overlap may occur due to factors such as memory cells changing charge over time, which is referred to herein as a data retention issue (or more briefly "data retention"). Some states tend to lose charge over time, and therefore may exhibit a drop in Vt over time. However, other states could gain charge over time, and therefor exhibit an increase in Vt over time. For some NAND memory cells there is a neutral Vt, which is a Vt that the memory cell will tend to move towards over time. Memory cells programmed to a Vt above the neutral Vt may tend to see a drop in Vt over time. Memory cells programmed to a Vt below the neutral Vt may tend to see an increase in Vt over time.

Figure 7:
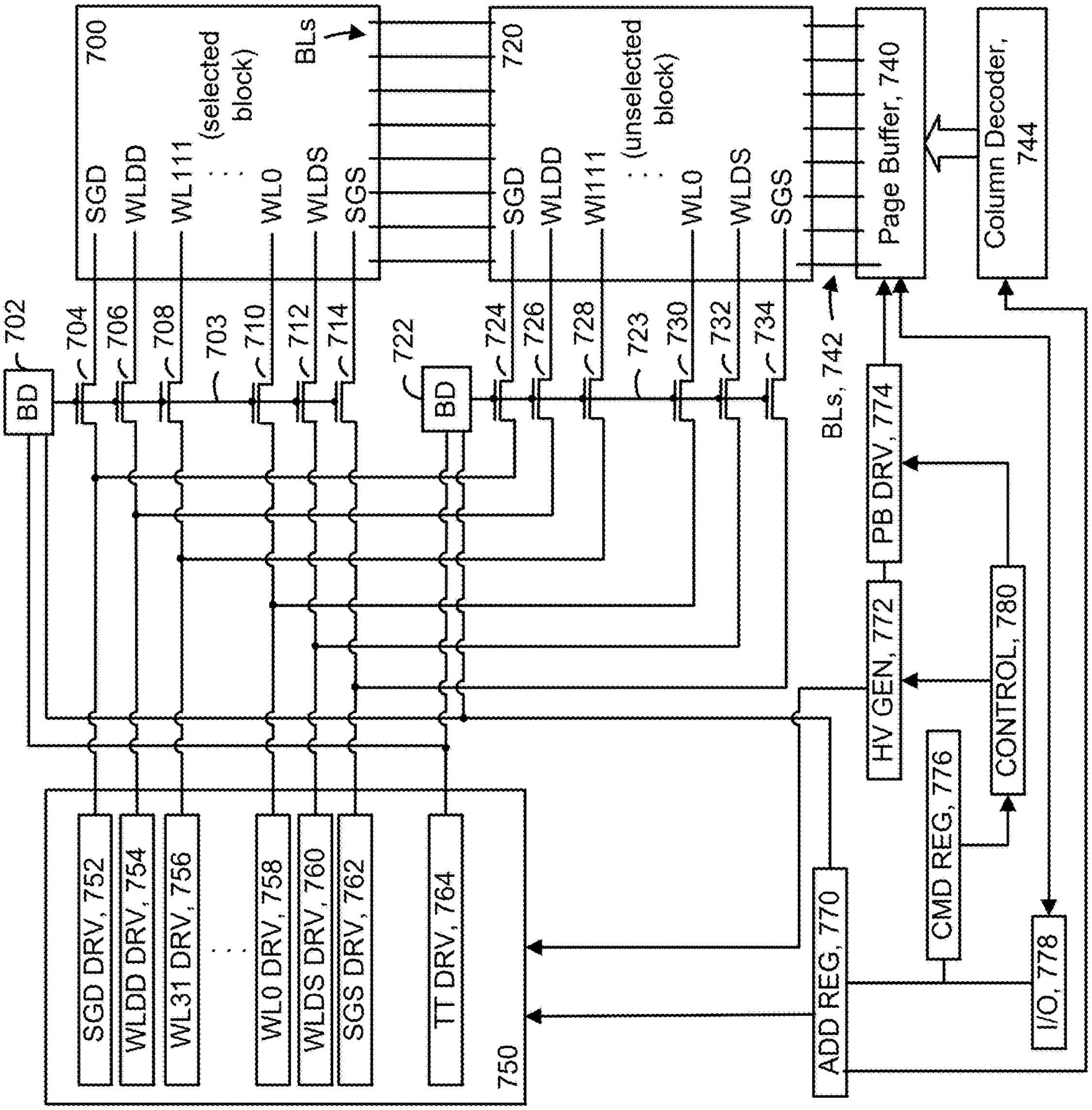
FIG. 7 depicts a memory device having circuitry for providing operating voltage to blocks of memory cells.

FIG. 7 depicts a memory device having circuitry for providing operating voltage to blocks of memory cells. Each block of storage elements is associated with a set of transfer transistors, in one possible embodiment. These transfer transistors may include WLSW transistors and also similar transistors for providing operating voltage to SGD and SGS. For example, block 700, which is the selected block in this example, e.g., a block in which a programming or sense operation is to take place, includes a drain-side select gate (SGD) connected to a transfer transistor 704, a drain-side dummy word line (WLDD) connected to a transfer transistor 706, a word line (WL111) connected to a transfer transistor 708, intermediate word lines WL110-WL1 (not shown) connected to respective transfer transistors (not shown), a word line (WL0) connected to a transfer transistor 710, a source-side dummy word line (WLDS) connected to a transfer transistor 712, and a source-side select gate (SGS) connected to a transfer transistor 714. Note that this is a simplified example and there may be more transfer transistors. The control gate of each transfer transistor of the block 700 is connected to a block decoder (BD) 702 via a common path 703. The BD 702 receives a voltage from a transfer transistor driver (TT DRV) 764 and a control signal from an address register (ADD REG) 770. The control signal includes an address. If the address matches an address of the BD 702, the BD 702 acts as a conductive switch which passes the voltage to the control gates of the associated transfer transistors via path 703. If the address does not match the address of the BD 702, the BD 702 acts as a non-conductive switch which does not pass the voltage to the control gates of the associated transfer transistors.

Each transfer transistor may be an nMOSFET, for example, which has a drain node on the left hand side and a source node on the right hand side (connected to the associated control line in the block 700, 720). The drain node for each transfer transistor is connected to a respective voltage driver in a set of high-voltage voltage drivers 750. Each driver may include an on-chip charge pump. For example, the transfer transistor 704 is connected to a drain select gate driver (SGD DRV) 752, the transfer transistor 706 is connected to a dummy word line driver (WLDD DRV) 754, the transfer transistor 708 is connected to the word line driver (WL31 DRV) 756, . . . , the transfer transistor 710 is connected to the word line driver (WL0 DRV) 758, the transfer transistor 712 is connected to the source side dummy word line driver (WLDS DRV) 760, and the transfer transistor 714 is connected to the source select gate driver (SGS DRV). Each voltage driver can be independently controlled to provide a desired output voltage.

A similar arrangement is used for the example unselected block 720, which includes a transfer transistor 724 connected to SGD and SGD DRV 752, a transfer transistor 726 connected to WLDD and WLDD DRV 754, a transfer transistor 728 connected to WL31 and WL31 DRV 756, . . . , a transfer transistor 730 connected to WL0 and WL0 DRV 758, a transfer transistor 732 connected to WLDS and WLDS DRV 760, and a transfer transistor 734 connected to SGS and SGS DRV 762. The control gates of the transfer transistors of the unselected block 720 are connected to a respective block decoder (BD) 722 via a common path 723. The BD 722 is also connected to the TT DRV 764 to receive a voltage, and to the address register 770 to receive a control signal which instructs the BD 722 to pass or not pass the voltage to the control gates of the associated transfer transistors via path 723. The address register (ADD REG) 770 also communicates with the voltage drivers in the set of high-voltage voltage drivers 750.

A number of bit lines (BLs) 742 extend across the selected block 700 and the unselected block 720 (and across additional unselected blocks, not shown, in some implementations) and into a page buffer 740, which is responsive to a column decoder 744. The page buffers stores data which is written into, or read from, a selected word line of the selected block. During an operation of the memory device, the address register 770 provides a data load command to an input-output buffer 778 and to a command register 776. The input-output buffer 778 provides the command to the page buffer 740. The command register 776 provides a command to a control circuit 780, which instructs a high voltage generator 772 to control the voltage drivers 750 at appropriate levels. Typically, during programming, the driver of the selected word line provides a programming level voltage, such as 12-26 V while the unselected word lines receive a boosting voltage $V_{PASS}$. During sensing, the driver of the selected word line provides a read or verify level voltage ($V_{CGR}$ or $V_{VERIFY}$, respectively), while the unselected word lines receive a read pass voltage, $V_{READ\text{-}PASS}$. The control 780 also instructs the page buffer driver (PB DRV) 774 to control the page buffer 740. The address register 770 also communicates with the column decoder 744.

Note that the schematic diagram in FIG. 7 does not necessarily reflect the physical layout of the WLSW transistors. In some architectures, a WLSW transistor that is connected to the selected block 720 may neighbor a WLSW transistor that is connected to the unselected block 722. For example, WLSW transistor 708 may neighbor WLSW transistor 728. Moreover, the source terminals of these two WLSW transistors may neighbor each other, separated by an insulator. Therefore, a leakage current could occur if the voltage difference between the two neighboring source terminals is too large. In an embodiment, the memory system pre-charges a word line in the unselected block 720 during a program operation in which a program voltage is provided to a selected word line in the selected block 700. This reduces the voltage difference between the two neighboring source terminals, which thereby reduces leakage current between the two neighboring source terminals. Therefore, the source terminals of neighboring WLSW transistors can be placed closer together which thereby allows chip area needed for the WLSW transistors to be reduced while still meeting tolerance for leakage current.

Figure 8:
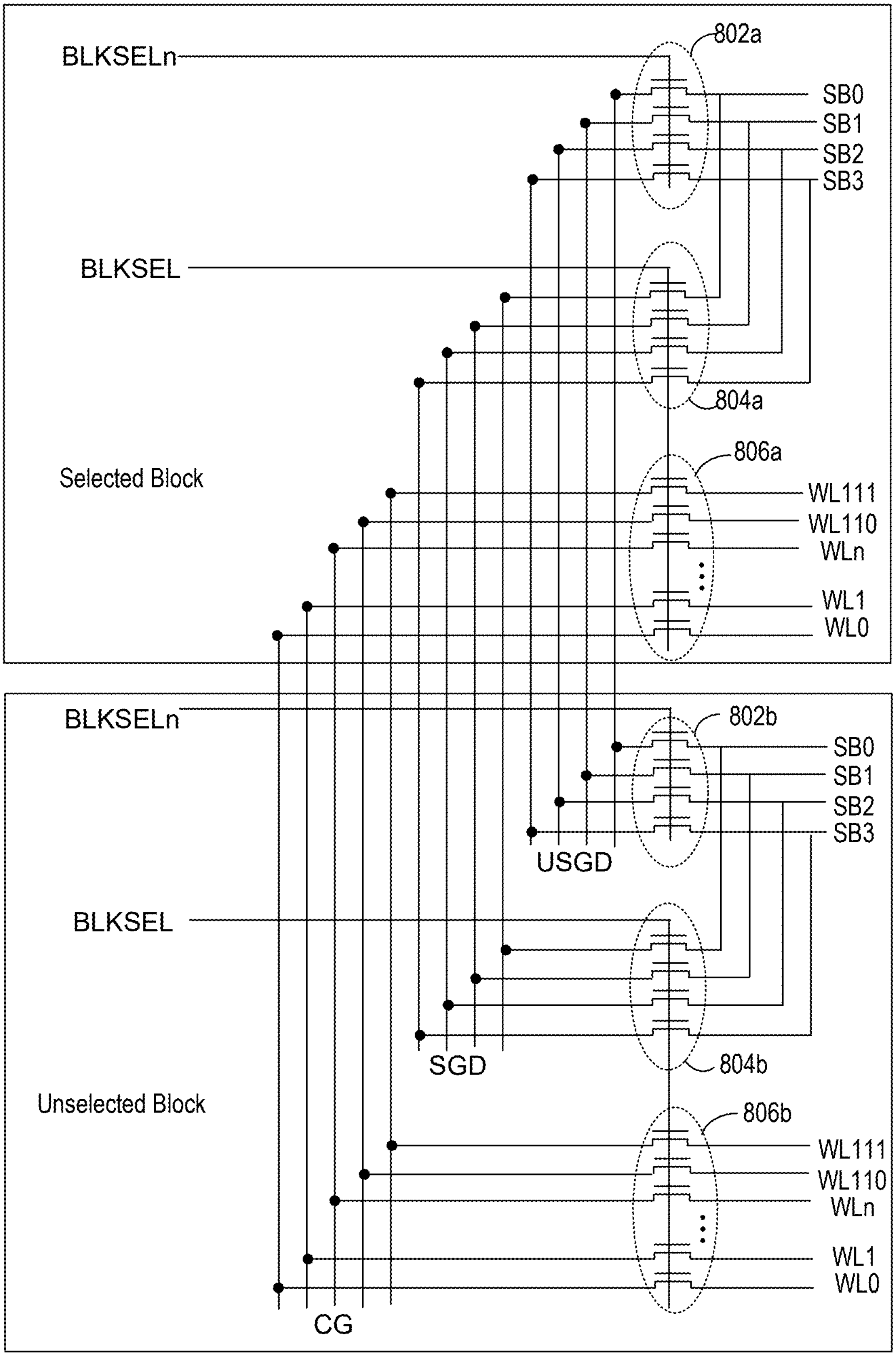
FIG. 8 is a schematic diagram of row control circuitry for two blocks.

FIG. 8 is a schematic diagram of row control circuitry for two blocks. The selected block has a set of WLSW transistors 806*a*, a first set of SGD switch transistors 802*a* and a second set of SGD switch transistors 804*a*. Similarly, the unselected block has a set of WLSW transistors 806*b*, a first set of SGD switch transistors 802*b* and a second set of SGD switch transistors 804*b*. The diagram shows that similar switch transistors in each block each have their respective drain connected to the same voltage.

In this example, the set of WLSW transistors 806*a* are connected to word lines WL0-WL 111. In this example, there are 112 word lines in a block, but there may be more or fewer word lines in a block. There may also be WLSW transistors for dummy word lines; however, those are not depicted in FIG. 8. An example voltage CG is applied to the drain of the WLSW transistors connected to WLn (in both the selected block and the unselected block). These two WLSW transistors may neighbor each other. In an embodiment, the voltage CG is set to a pre-charge voltage to pre-charge WLn in the unselected block during a program operation. Later in the program operation CG will be set to Vpgm to pass Vpgm to the selected word line (WLn) in the selected block. The pre-charge voltage may prevent leakage current between these two WLSW transistors.

A simplified set of SGD switch transistors is depicted in FIG. 8. In this example, there are four sub-blocks (SB0, SB1, SB2, SB3) in a block. Each sub-block has its own SGD line. In this example, the voltage SGD is applied to drains of the second set of SGD switch transistors 804*a*. The gates of the second set of SGD switch transistors 804*a* are driven by BLKSEL. Note that the voltage SGD for the selected block may be used to select one of the sub-blocks. In this example, the voltage USGD is applied to drains of the first set of SGD switch transistors 802*a*. The gates of the first set of SGD switch transistors 802*a* are driven by BLKSELn. Hence, the first set of SGD switch transistors 802*a* may pass USGD to SGD lines in unselected blocks.

Figure 9:
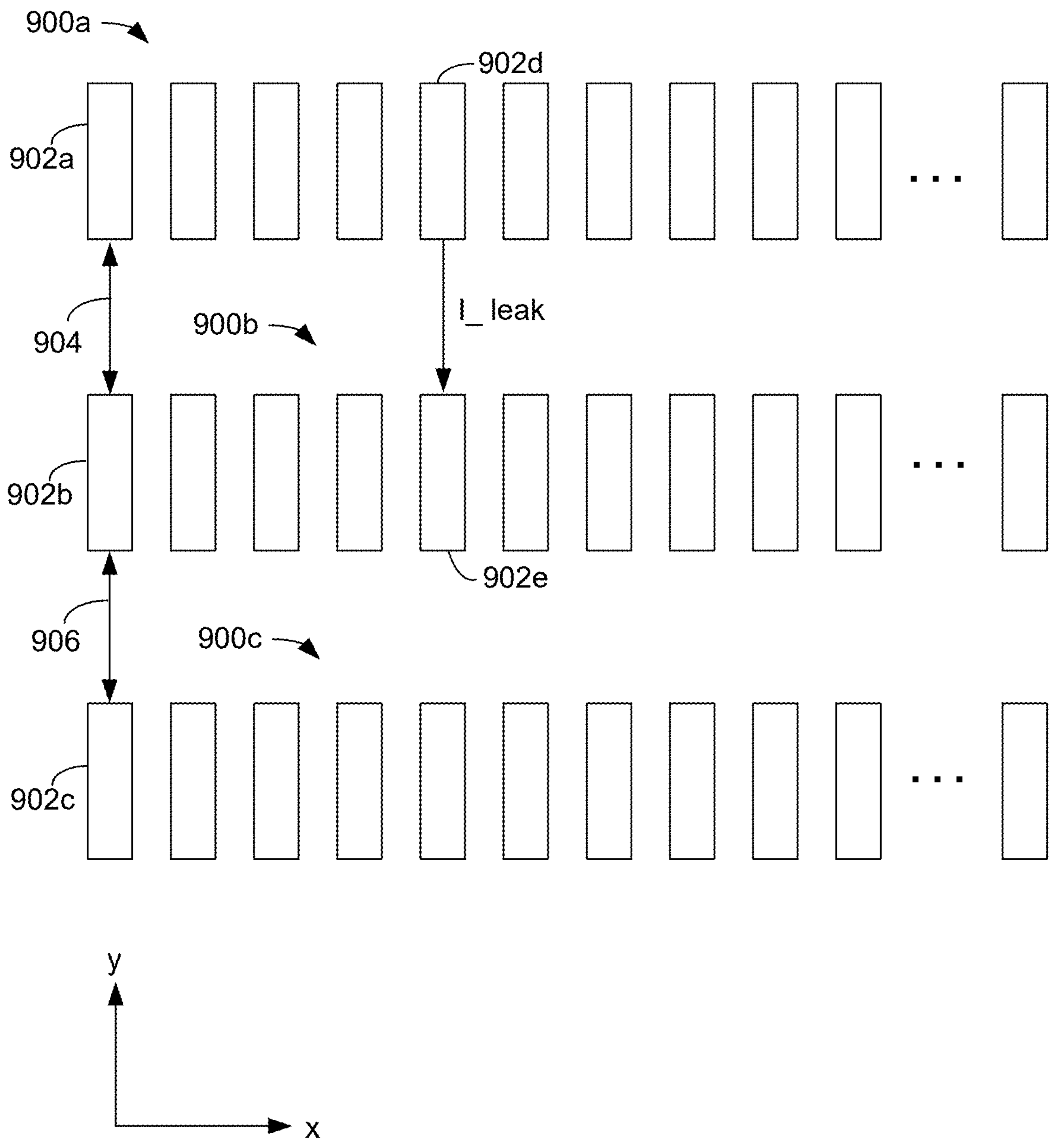
FIG. 9 is a block diagram illustrating one possible layout for WLSW transistors.

FIG. 9 is a block diagram illustrating one possible layout for WLSW transistors. In this example each rectangular area represents a WLSW transistor. The WLSW transistors 902 are arranged in rows 900*a*, 900*b*, 900*c*. In one possible configuration, each row 900 contains the WLSW transistors 902 for one block of memory cells. However, other configurations are possible. WLSW transistors 902*a* and 902*b* are neighbors. WLSW transistors 902*b* and 902*c* are neighbors. Double sided arrow 904 represents the separation between WLSW transistor 902*a* and 902*b*. Similarly, double sided arrow 906 represents the separation between WLSW transistor 902*b* and 902*c*. The separation between neighboring WLSW transistors 902 may be an insulator. The voltages present on the neighboring terminals (e.g., sources) of the neighboring WLSW transistors 902 and the distance separating the neighboring WLSW transistors 902 are factors that may result in leakage current between the neighboring WLSW transistors 902. An example leakage current (I_leak) is depicted between neighboring WLSW transistors 902*d*, 902*e*. One possible solution to keep the leakage current to a tolerable level is to design the chip such that the distance between the rows 900 is sufficiently large. However, an embodiments of a memory system disclosed herein controls the WLSW transistors 902 in a manner to reduce the leakage current between neighboring WLSW transistors 902, which allows the chip to be designed with a smaller gap between rows 900 of WLSW transistors 902. Reducing the distance between the rows 900 of WLSW transistors 902 reduces the total length needed in the y-direction for a given number of rows 900. One option is to keep the same number of rows, thereby reducing chip area in the y-direction. Another option is to place more rows 900 of WLSW transistors 902 into the same y-length. Consequently, fewer WLSW transistors 902 are needed per row 900, which allows shrinkage in the x-direction. These two options may each be pursued. Therefore, chip area may be reduced in the x-direction and/or the y-direction.

Figure 10:
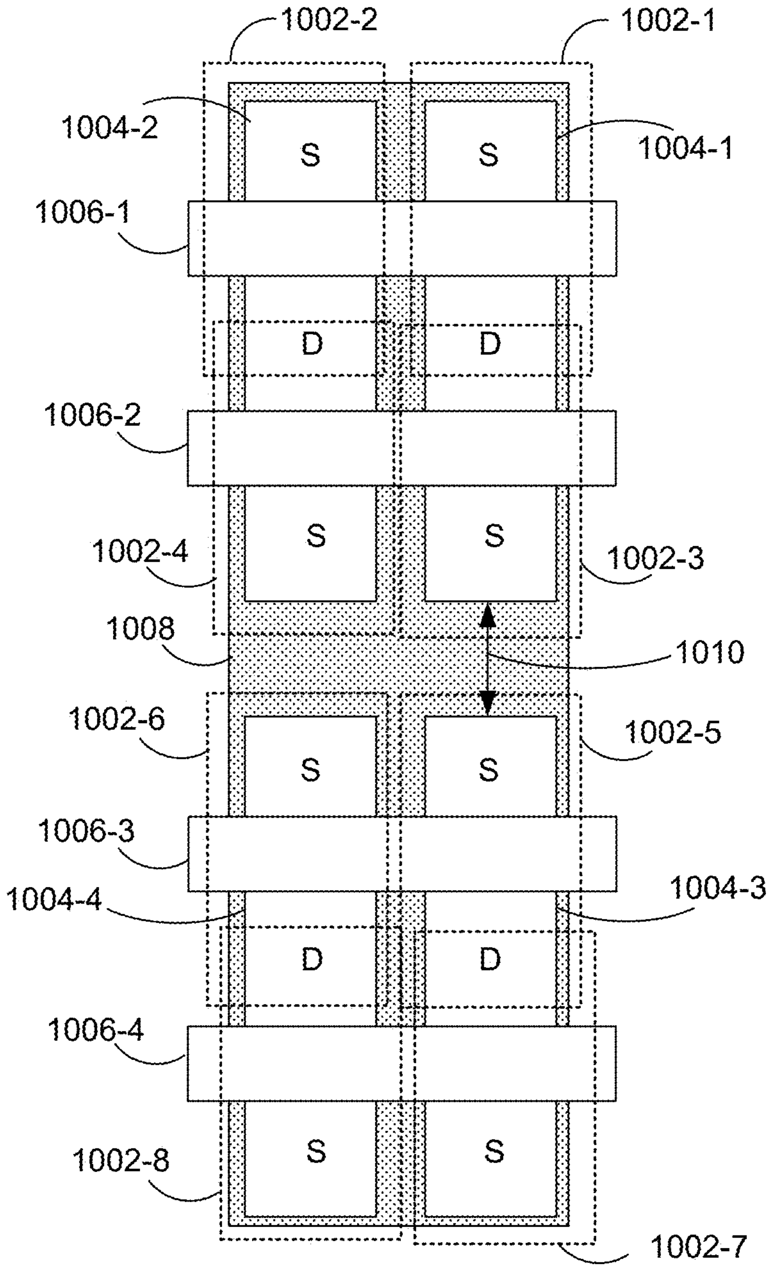
FIG. 10 shows further details of a layout of WLSW transistors.

FIG. 10 shows further details of a layout of WLSW transistors. A total of eight WLSW transistors are depicted in FIG. 10. Four Active Areas (AA) 1004-1, 1004-2, 1004-3, and 1004-4 reside within an insulating region 1008. The insulating region 1008 may be, for example, silicon oxide or some other insulator. The active areas 1004 may include a semiconductor such as, for example, silicon. The active areas 1004 may be doped to formed source regions(S) and drain regions (D). In this example, each active area 1004 has two source regions(S) and a drain region (D). The drain region (D) is shared by two WLSW transistors. A number of gates 1006-1, 1006-2, 1006-3, 1006-4 are depicted. The gates 1006 may be formed of a conductor. WLSW transistor 1002-1 is formed from one of the source region(S) of active area 1004-1, at least a portion of the drain region (D) of active area 1004-1, and a portion of gate 1006-1. The region of the active area 1004-1 under the gate 1006-1 serves as the channel of the WLSW transistor 1002-1. Other WLSW transistors 1002-2, 1002-3, 1002-4, 1002-5, 1002-6, 1002-7, and 1002-8 are formed in a similar manner.

In an embodiment, each source region(S) is connected to a different word line in a memory structure, such as a 3D NAND memory structure. The memory system may provide suitable voltages to the drain regions (D) and the gates 1006 in order to control what voltages the WLSW transistors 1002 pass on to the word lines.

Double sided arrow 1010 indicates the separation between the source region(S) of WLSW transistor 1002-3 and WLSW transistor 1002-5. These two source regions(S) are separated by a portion of the insulator region 1008. Depending on the voltages on the two source regions(S) is it possible for there to be a leakage current from one source region(S) through the insulator region 1008 to the neighboring source region(S).

For the sake of example, the source region(S) of WLSW transistor 1002-3 may be connected to the word line that is selected for programming, whereas the source region(S) of WLSW transistor 1002-5 may be connected to a word line in an unselected block. Therefore, during programming a program voltage will appear at the source region(S) of WLSW transistor 1002-3. An embodiment of a memory system applies suitable voltages to WLSW 1002-5 to pre-charge the word line to which the source region(S) of WLSW 1002-5 is connected. The source region(S) of WLSW 1002-5 will be at this pre-charge voltage when programming the selected word line. This reduces the voltage difference between the source (S) of WLSW transistor 1002-3 and the source(S) of WLSW transistor 1002-5, which reduces leakage current between these two source regions. This allows the distance 1010 to be reduced, which allows chip area needed for the WLSW transistors 1002 to be reduced while maintaining leakage current at a tolerable level.

Figure 11A:
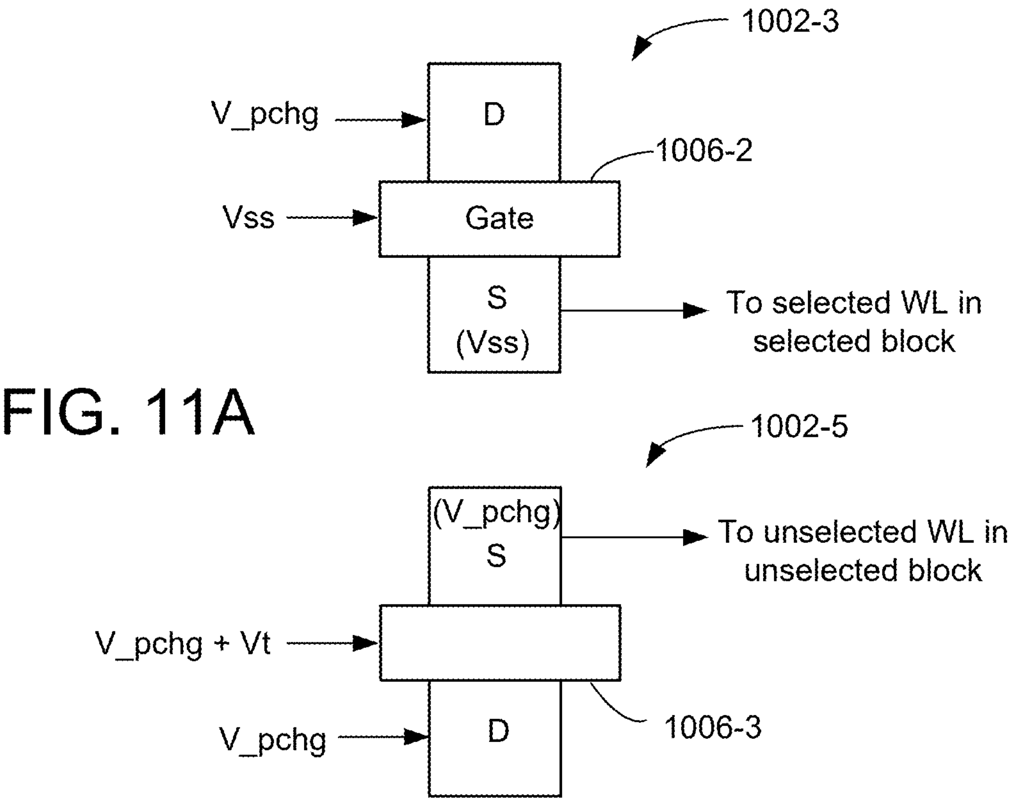
FIG. 11A shows two neighboring WLSW transistors with voltages applied during a pre-charge phase of a programming operation by an embodiment of a control circuit in memory system.

FIG. 11A shows two neighboring WLSW transistors with voltages applied during a pre-charge phase of a programming operation by an embodiment of a control circuit in memory system. The two neighboring transistors 1002-3, 1002-5 were also depicted in FIG. 10. The source(S) of WLSW transistor 1002-3 is configured to connect to the selected WL in the selected block. The source(S) of WLSW transistor 1002-5 is configured to connect to the unselected WL in the unselected block. Note that the WLSW transistor 1002-3, 1002-5 may be on the same semiconductor die as the word lines (e.g., memory die 200 in FIG. 2A) or on a different semiconductor die (e.g., control die 211 in FIG. 2B) than the word lines (which may be on the memory structure die 201). The memory system applies a pre-charge voltage (V_pchg) to the drain (D) of WLSW transistor 1002-5 while applying a voltage of at least V_pchg+Vt to the gate 1006-3 of WLSW transistor 1002-5. Here, Vt refers to the threshold voltage of WLSW transistor 1002-5. The gate voltage can be greater than V_pchg+Vt, such as a voltage that might be applied to the gate to pass a lower voltage program voltage (Vpgm). An example of a lower voltage Vpgm is the Vpgm used in the first loop of a program operation. As a result of the drain (D) and gate 1006-3 voltages, the source(S) of WLSW transistor 1002-5 will be at about V_pchg.

The memory system may also apply V_pchg to the drain (D) of WLSW transistor 1002-3. In some cases the drains of these two WLSW transistors 1002-3 are 1002-5 are connected to the same voltage driver and hence receive the same voltage. However, it is not required that the drains of these two WLSW transistors 1002-3 are 1002-5 be connected to the same voltage driver or to receive the same voltage. The gate 1006-2 of WLSW transistor 1002-3 receives Vss (about 0V). As a result, Vss appears at the source (S) of WLSW transistor 1002-3.

Figure 11B:
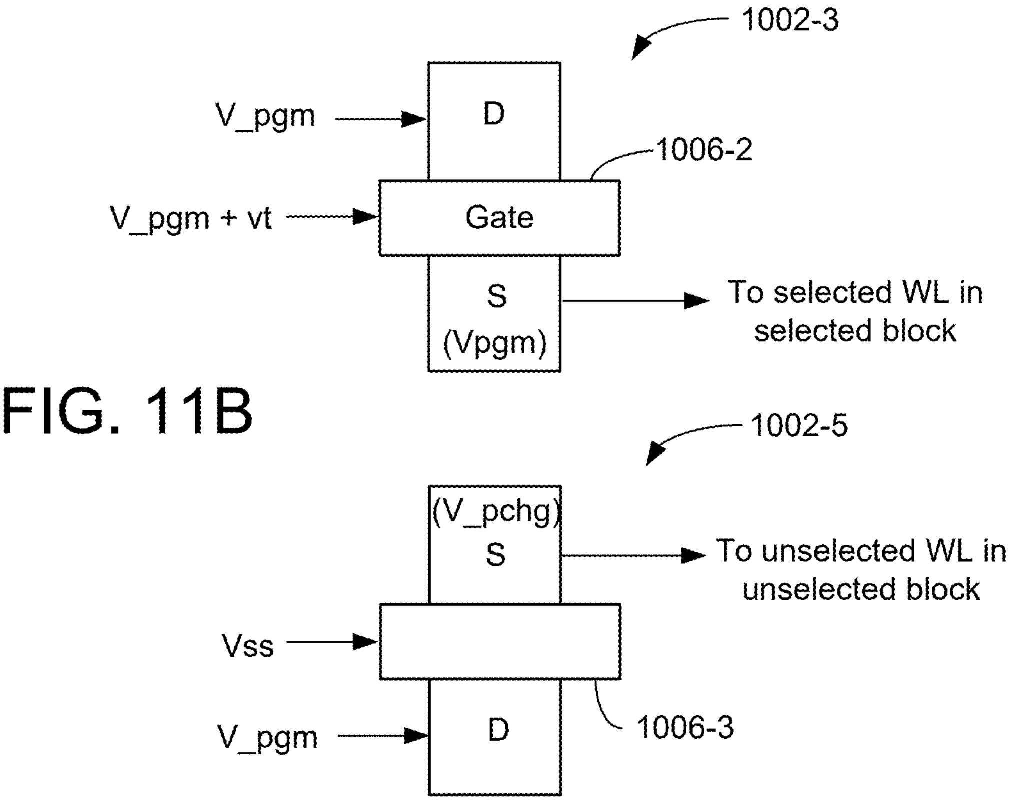
FIG. 11B the two neighboring WLSW transistors with voltages applied during a program phase of the programming operation by an embodiment of the control circuit in the memory system.

FIG. 11B shows the two neighboring WLSW transistors with voltages applied during a program phase of the programming operation by an embodiment of the control circuit in the memory system. The memory system applies V_pgm to the drain (D) of WLSW transistor 1002-3 while applying a voltage of at least V_pgm+Vt to the gate 1006-2 of WLSW transistor 1002-3. Here, Vt refers to the threshold voltage of WLSW transistor 1002-3. The gate voltage can be greater than V_pgm+Vt. As a result of the drain (D) and gate 1006-2 voltages, the source (S) of WLSW transistor 1002-3 will be at about V_pgm.

The memory system may also apply V_pgm to the drain (D) of WLSW transistor 1002-5. As noted above. the drains of these two WLSW transistors 1002-3 are 1002-5 may be connected to the same voltage driver and hence receive the same voltage. However, it is not required that the drains of these two WLSW transistors 1002-3 are 1002-5 be connected to the same voltage driver or to receive the same voltage. The gate 1006-3 of WLSW transistor 1002-5 receives Vss (about 0V). As a result, the unselected WL in the unselected block is floating at the pre-charge voltage (V_pchg), which appears at the source (S) of WLSW transistor 1002-5.

Therefore, the voltage difference between the neighboring sources is Vpgm-V_pchg. As non-limited examples, V_pchg may have a magnitude of about 2V to 3V. However, V_pchg could be less than 2V or greater than 3V. If the pre-charge phase had not been performed then the (S) of WLSW transistor 1002-5 could be at, for example, between about 0v to about 0.5V. Note that if the pre-charge phase were not performed there could be some leakage between the drain and source of WLSW transistor 1002-5 due to the large voltage difference between drain and source, which is why the source could increase to about 0.5V. However, the pre-charging results in a smaller voltage difference between the neighboring sources (Vpgm-V_pchg) than if no pre-charging were performed. Therefore, leakage current may be reduced. As has been discussed above, the reduction of leakage current allows the layout of the WLSW transistors to be modified to shrink the gap between the neighboring sources. Therefore, it is possible to reduce chip area of the WLSW transistors while still maintaining a tolerable leakage current.

Figure 12:
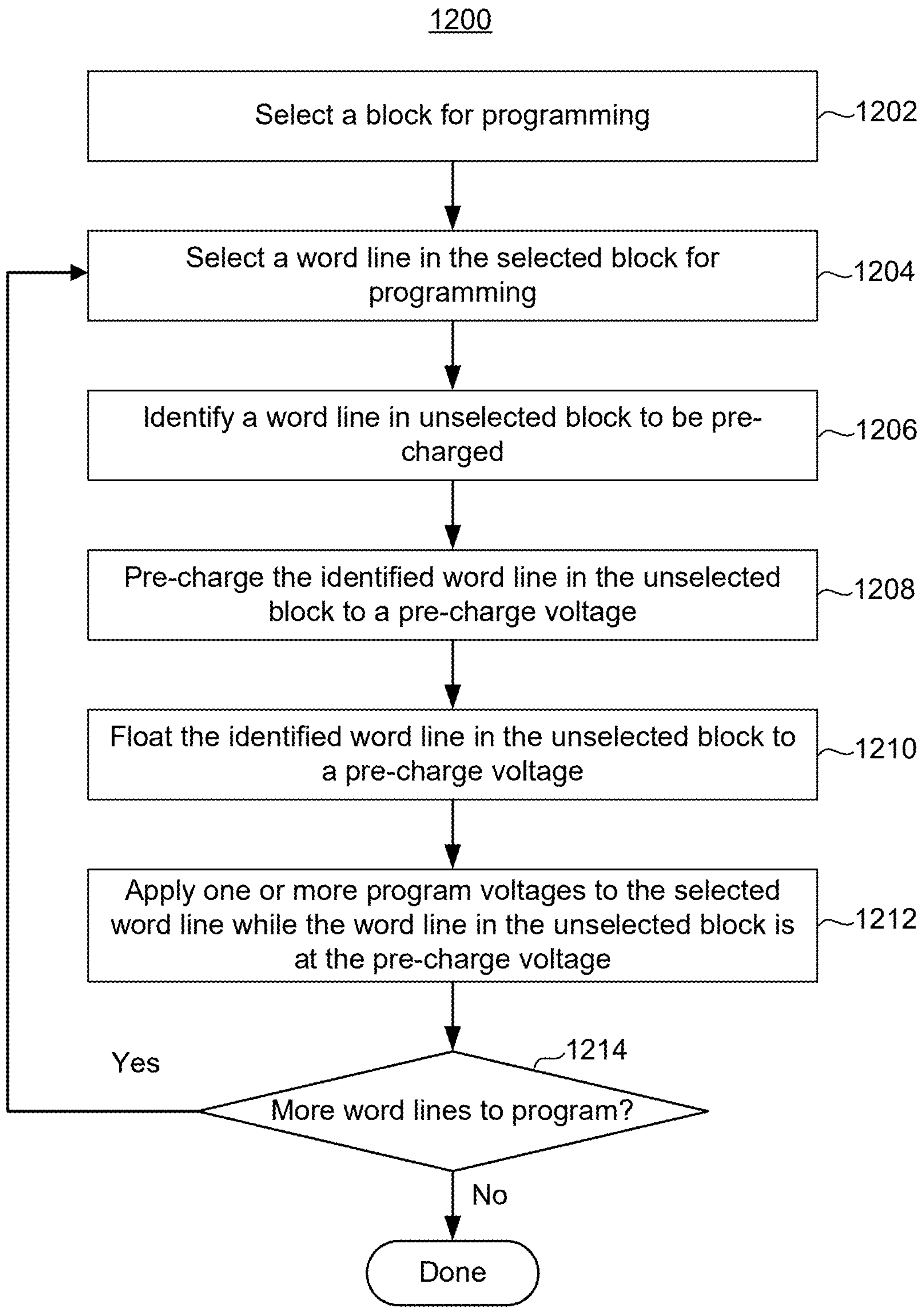
FIG. 12 is a flowchart of one embodiment of a process of programming memory cells.

FIG. 12 is a flowchart of one embodiment of a process 1200 of programming memory cells. The process 1200 may be performed by, for example, one or more control circuits on control die 211 or memory die 200. The one or more control circuits may include one or more of system control logic 260, row control circuitry 220 and/or column control circuitry 210. The process 1200 may be performed in response to one or more commands from the memory controller 120. Step 1202 includes selecting a block for programming. Step 1204 includes selected a word line for programming. The memory controller 120 may specify what blocks and word lines are to be programmed.

Step 1206 includes identifying a word line in an unselected block to be pre-charged. In an embodiment the word line to be pre-charged depends on the layout of the WLSW transistors. For example, referring to FIGS. 10, 11A, and 11B, the choice of the word line to be pre-charged may be based on what WLSW transistor neighbors the WLSW transistor that is to provide the program voltage to the selected word line. In an embodiment, the WLSW transistor to be pre-charged is connected to a word line in an unselected block. In an embodiment, the source terminal of the WLSW transistor to be pre-charged is adjacent to (i.e., neighbors) the source terminal of the WLSW transistor to provide the program voltage to the selected word line.

Step 1208 includes pre-charging the identified word line in the unselected block to a pre-charge voltage. Step 1208 may include providing the pre-charge voltage to a drain of the WLSW transistor that provides the voltage to the unselected word line in the unselected block.

Step 1210 includes floating the unselected word line in the unselected block, wherein the voltage on the unselected word line in the unselected block remains at or near the pre-charge voltage. Therefore, the source of the WLSW transistor connected to the unselected word line in the unselected block remains at or close to the pre-charge voltage. Optionally, step 1210 may include discharging the pre-charge voltage that was provided to the drain of the WLSW transistor that provides the voltage to the unselected word line in the unselected block.

Step 1212 includes applying one or more program voltages to the selected word line in the selected block while the unselected word line in the unselected block remains at the pre-charge voltage. Step 1212 may include performing the process of FIG. 5. Therefore, the voltage difference between the neighboring sources is reduced (see FIG. 11B). Therefore, leakage current between the neighboring sources is reduced.

Step 1214 includes determining whether there are more word lines to program in the selected block. If so, the process returns to step 1204 to select another word line for programming. When step 1206 is performed again a new word line may be identified for pre-charging. When there are no more word lines to program in the selected block the process ends.

Figure 13:
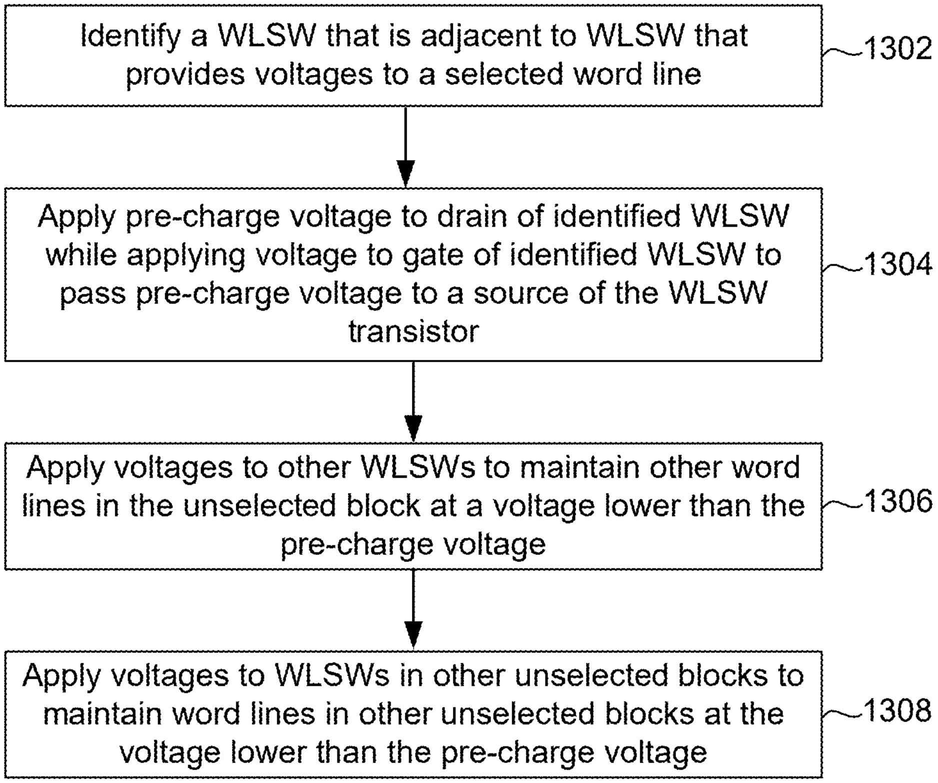
FIG. 13 is a flowchart of one embodiment of a process of operating WLSW transistors during a programming process.

FIG. 13 is a flowchart of one embodiment of a process 1300 of operating WLSW transistors during a programming process. The process 1300 provides further details of an embodiment of steps 1206-1210 of process 1200. The process 1300 may be performed by, for example, one or more control circuits on control die 211 or memory die 200.

Step 1302 includes identifying a WLSW transistor that is adjacent (neighboring) to a WLSW transistor that provides voltages to a selected word line. Step 1304 includes applying a pre-charge voltage to a drain of the identified WLSW transistor while applying a voltage to a gate of the identified WLSW transistor to pass the pre-charge voltage to a source of the identified WLSW transistor. Step 1306 includes applying voltages to other WLSW transistors to maintain other word lines in the unselected block at a voltage lower than the pre-charge voltage. Step 1308 includes applying voltages to WLSW transistors in other unselected blocks to maintain word lines other unselected blocks at the voltage lower than the pre-charge voltage. FIG. 14 shows further details of timing of voltages in an embodiment of process 1300.

Figure 14A:
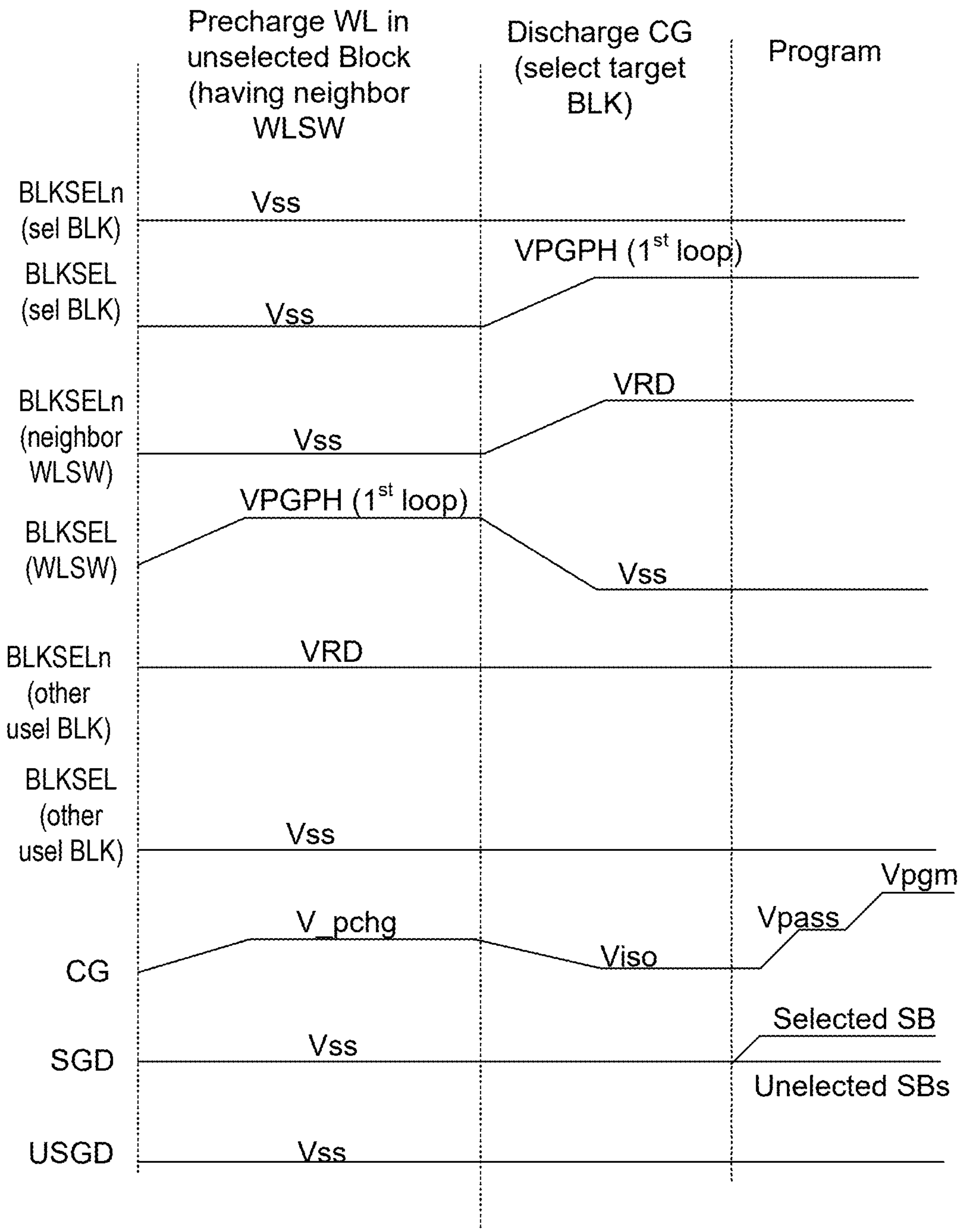
FIG. 14A depicts timing of voltages applied within row control circuitry.

FIG. 14A depicts timing of voltages applied within row control circuitry. The voltage waveforms correspond to signals in the example row decode circuitry of FIG. 8. The initial phase is the pre-charge of a word line in an unselected block that is associated with the WLSW transistors that neighbors the WLSW transistor connected to the selected word line in the selected block. It is possible that this unselected block neighbors the selected block, but that is not a requirement. Timing is depicted for the selected block, the unselected block having the neighbor WLSW transistor, and other unselected blocks.

The following describes voltages during the pre-charge phase. BLKSELn and BLKSEL for the selected block (sel BLK) are each at Vss (e.g., 0V). BLKSELn for the neighbor unselected block is at Vss. BLKSEL for the neighbor unselected block is ramped up to VPGPH ($1^{st}$ loop). VPGPH ($1^{st}$ loop) refers to a voltage having a sufficient magnitude to pass a Vpgm used in the $1^{st}$ loop of programming. However, the voltage to BLKSEL could have a smaller or larger magnitude than VPGPH ($1^{st}$ loop). For other unselected blocks BLKSELn for is at VRD and BLKSEL is at Vss. CG is ramped up to V_pchg (the pre-charge voltage). CG may be applied to the drains of the neighbor WLSW transistor and to the WLSW transistor connected to the selected word line. It is not required that CG be applied to the drains of all of the WLSW transistors. In an embodiment, the drains of other WLSW transistors may be provided with a different voltage such as Vss. SGD and USGD are each at Vss. The voltages just described for the pre-charge phase may be used in an embodiment of steps 1304, 1306, and 1308 of process 1300.

The following describes voltages a discharge phase in which the CG voltage is reduced from the pre-charge voltage (V_pchg) to a lower voltage (Viso). This discharge refers to a discharge at the drain of the neighboring WLSW transistor. For the selected block BLKSELn remains at Vss. However, BLKSEL for the selected block is ramped up to VPGPH ($1^{st}$ loop). For the unselected block having the neighbor WLSW transistor BLKSELn increases to VRD and BLKSEL is reduced to Vss. Reducing BLKSEL to Vss may result in turning off the neighbor WLSW transistor. However, the voltage at the source of the neighbor WLSW transistor remains at the pre-charge voltage. Note that the word line connected to this neighbor WLSW transistor may float while the neighbor WLSW transistor is off. For other unselected blocks BLKSELn remains at VRD and BLKSEL remains at Vss. CG is ramped down from V_pchg (the pre-charge voltage) to Viso. SGD and USGD each remain at Vss.

During the program phase one of the sub-blocks is selected by raising the voltage of one of the SGD switches. The CG voltage to the selected word line is raised to a boosting voltage (Vpass) followed by raising to the program voltage (Vpgm). The pre-charge voltage may appear at the source of the neighboring WLSW transistor while the program voltage (Vpgm) appears at the source of the WLSW transistor connected to the selected word line (see FIG. 11B). Note that the neighboring WLSW transistor may have Vpgm applied to its drain it this stage. However, the neighboring WLSW transistor has Vss on its gate such that Vpgm does not pass to the source of the neighboring WLSW transistor.

Figure 14B:
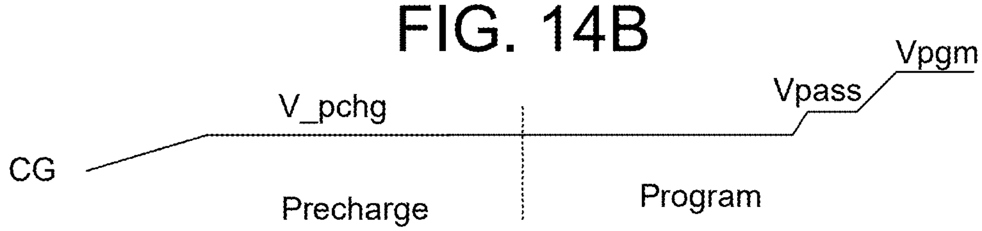
FIG. 14B depicts an alternative embodiment in which the pre-charge voltage (V_pchg) is not discharged.

FIG. 14B depicts an alternative embodiment in which the CG pre-charge voltage (V_pchg) is not discharged to Viso. The timing of the other voltages may be the same as in FIG. 14A.

In view of the foregoing, an embodiment includes an apparatus comprising a plurality of word line switch (WLSW) transistors configured to connect to word lines of a memory structure having a plurality of blocks each having memory cells and word lines. The plurality of WLSW transistors are divided into a set of WLSW transistors for each block of the plurality of blocks in the memory structure. The apparatus comprises one or more control circuits in communication with the plurality of WLSW transistors. The one or more control circuits configured to select a group of the memory cells connected to a selected word line in a selected block for a program operation. A first terminal of a first WLSW transistor in a first set of the WLSW transistors is configured to connect to and provide a voltage to the selected word line and a second terminal of a second WLSW transistor in a second set of the WLSW transistors is configured to connect to and provide a voltage to a word line in an unselected block. The first terminal neighbors the second terminal and an insulator separates the first terminal from the second terminal. The one or more control circuits are configured to apply voltages to the second WLSW transistor to pre-charge the word line in the unselected block to a pre-charge voltage. The one or more control circuits are configured to apply voltages to the second WLSW transistor to float the word line in the unselected block at the pre-charge voltage. The one or more control circuits are configured to apply voltages to the first WLSW transistor to apply a program voltage to the selected word line while the word line in the unselected block floats at the pre-charge voltage.

In a further embodiment of the apparatus, the one or more control circuits are further configured to operate other WLSW transistors in the second set of WLSW transistors to maintain other word lines in the unselected block at a lower voltage than the pre-charge voltage while pre-charging the word line in the unselected block with the second WLSW transistor to the pre-charge voltage.

In a further embodiment of the apparatus, the one or more control circuits are further configured to operate other WLSW transistors in the second set of WLSW transistors to maintain other word lines in the unselected block substantially at ground while pre-charging the word line in the unselected block with the second WLSW transistor to the pre-charge voltage.

In a further embodiment of the apparatus, the one or more control circuits are further configured to maintain other WLSW transistors in the second set of WLSW transistors in an off state while pre-charging the word line in the unselected block with the second WLSW transistor to the pre-charge voltage.

In a further embodiment of the apparatus, the one or more control circuits are further configured to operate WLSW transistors in substantially all other sets of the WLSW transistors to maintain word lines in substantially all other blocks in the memory structure at a lower voltage than the pre-charge voltage while pre-charging the word line in the unselected block with the second WLSW transistor to the pre-charge voltage.

In a further embodiment of the apparatus, the one or more control circuits are further configured to operate WLSW transistors in substantially all other sets of the WLSW transistors to maintain substantially all word lines in substantially all other blocks at approximately ground while pre-charging the word line in the unselected block with the second WLSW transistor to the pre-charge voltage.

In a further embodiment of the apparatus, the memory cells reside on NAND strings, each NAND string comprising a set of the memory cells, a drain side select gate associated with a bit line and a source side select gate associated with a source line.

A further embodiment of the apparatus comprises a plurality of drain side gate switch transistors configured to connect to the drain side select gates of the NAND strings. The plurality of drain side gate switch transistors are divided into a set of drain side gate switch transistors for each block of the plurality of blocks in the memory structure. The apparatus further comprises a plurality of source side gate switch transistors configured to connect to the source side select gates of the NAND strings. The plurality of source side gate switch transistors are divided into a set of source side gate switch transistors for each block of the plurality of blocks in the memory structure. The one or more control circuits are further configured to operate the drain side select gate switch transistors and the source side gate switch transistors to cut off each drain side select gate from the associated bit line and each source side select gate from the associated source line while pre-charging the word line in the unselected block with the second WLSW transistor to the pre-charge voltage.

In a further embodiment of the apparatus the one or more control circuits are further configured to operate the drain side select gate switch transistors and the source side gate switch transistors to ground the drain side gates and ground the source side select gates while pre-charging the word line in the unselected block with the second WLSW transistor to the pre-charge voltage.

In a further embodiment of the apparatus the pre-charge voltage remains on the second terminal of the second WLSW transistor while the program voltage is on the first terminal of the first WLSW transistor.

In a further embodiment of the apparatus the one or more control circuits are configured to select a magnitude of the pre-charge voltage to reduce leakage current between the first terminal and the second terminal.

An embodiment includes a method for operating non-volatile storage. The method comprises identifying a selected word line in a selected block in the non-volatile storage for programming. The selected word line is connected to a set of NAND memory cells. The method comprises applying voltages to a first word line switch transistor to charge a first word line in an unselected block to a pre-charge voltage. The method comprises turning off the first word line switch transistor to float the first word line in the unselected block at the pre-charge voltage. The method comprises applying voltages to a second word line switch transistor adjacent to the first word line switch transistor to apply a program voltage to the selected word line in the selected block while the first word line in the unselected block floats at the pre-charge voltage.

An embodiment includes a non-volatile memory system, comprising a memory structure having a plurality of blocks. Each block has NAND strings and word lines associated with the NAND strings. The non-volatile memory system has a plurality of sets of word line switch (WLSW) transistors. Each set of the WLSW transistors is configured to provide voltages to the word lines in one of the blocks. The non-volatile memory system has one or more control circuits in communication with the memory structure and the plurality of sets of WLSW transistors. The one or more control circuits configured to identify a selected word line in a selected block for programming. A first WLSW transistor in a first set of the WLSW transistors is configured to connect to and provide voltages to the selected word line. The one or more control circuits configured to identify a second WLSW transistor in a second set of the WLSW transistors that neighbors the first WLSW transistor. The one or more control circuits configured to apply voltages to the second WLSW transistor to charge an unselected word line in an unselected block to a pre-charge voltage. The one or more control circuits configured to apply voltages to the second WLSW transistor to turn off the second WLSW transistor after charging the unselected word line to the pre-charge voltage. The one or more control circuits configured to apply voltages to the first WLSW transistor to apply a program voltage to the selected word line while the unselected word line remains at the pre-charge voltage.

For purposes of this document, reference in the specification to “an embodiment,” “one embodiment,” “some embodiments,” or “another embodiment” may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are “in communication” if they are directly or indirectly connected so that they can communicate electronic signals between them.

For purposes of this document, the term “based on” may be read as “based at least in part on.”

For purposes of this document, without additional context, use of numerical terms such as a “first” object, a “second” object, and a “third” object may not imply an ordering of objects, but may instead be used for identification purposes to identify different objects.

For purposes of this document, the term “set” of objects may refer to a “set” of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

a plurality of word line switch (WLSW) transistors configured to connect to word lines of a memory structure having a plurality of blocks each having memory cells and word lines, the plurality of WLSW transistors divided into a set of WLSW transistors for each block of the plurality of blocks in the memory structure; and one or more control circuits in communication with the plurality of WLSW transistors, the one or more control circuits configured to:

select a group of the memory cells connected to a selected word line in a selected block for a program operation, wherein a first terminal of a first WLSW transistor in a first set of the WLSW transistors is configured to connect to and provide a voltage to the selected word line and a second terminal of a second WLSW transistor in a second set of the WLSW transistors is configured to connect to and provide a voltage to a word line in an unselected block, wherein the first terminal neighbors the second terminal and an insulator separates the first terminal from the second terminal;

apply voltages to the second WLSW transistor to pre-charge the word line in the unselected block to a pre-charge voltage;

apply voltages to the second WLSW transistor to float the word line in the unselected block at the pre-charge voltage; and apply voltages to the first WLSW transistor to apply a program voltage to the selected word line while the word line in the unselected block floats at the pre-charge voltage.

2. The apparatus of claim 1, wherein the one or more control circuits are further configured to:

operate other WLSW transistors in the second set of WLSW transistors to maintain other word lines in the unselected block at a lower voltage than the pre-charge voltage while pre-charging the word line in the unselected block with the second WLSW transistor to the pre-charge voltage.

3. The apparatus of claim 1, wherein the one or more control circuits are further configured to:

operate other WLSW transistors in the second set of WLSW transistors to maintain other word lines in the unselected block substantially at ground while pre-charging the word line in the unselected block with the second WLSW transistor to the pre-charge voltage.

4. The apparatus of claim 1, wherein the one or more control circuits are further configured to:

maintain other WLSW transistors in the second set of WLSW transistors in an off state while pre-charging the word line in the unselected block with the second WLSW transistor to the pre-charge voltage.

5. The apparatus of claim 1, wherein the one or more control circuits are further configured to:

operate WLSW transistors in substantially all other sets of the WLSW transistors to maintain word lines in substantially all other blocks in the memory structure at a lower voltage than the pre-charge voltage while pre-charging the word line in the unselected block with the second WLSW transistor to the pre-charge voltage.

6. The apparatus of claim 1, wherein the one or more control circuits are further configured to:

operate WLSW transistors in substantially all other sets of the WLSW transistors to maintain substantially all word lines in substantially all other blocks at approximately ground while pre-charging the word line in the unselected block with the second WLSW transistor to the pre-charge voltage.

7. The apparatus of claim 1, wherein the memory cells reside on NAND strings, each NAND string comprising a set of the memory cells, a drain side select gate associated with a bit line and a source side select gate associated with a source line.

8. The apparatus of claim 7, further comprising:

a plurality of drain side gate switch transistors configured to connect to the drain side select gates of the NAND strings, the plurality of drain side gate switch transistors divided into a set of drain side gate switch transistors for each block of the plurality of blocks in the memory structure; and a plurality of source side gate switch transistors configured to connect to the source side select gates of the NAND strings, the plurality of source side gate switch transistors divided into a set of source side gate switch transistors for each block of the plurality of blocks in the memory structure;

wherein the one or more control circuits are further configured to operate the drain side select gate switch transistors and the source side gate switch transistors to cut off each drain side select gate from the associated bit line and each source side select gate from the associated source line while pre-charging the word line in the unselected block with the second WLSW transistor to the pre-charge voltage.

9. The apparatus of claim 8, wherein the one or more control circuits are further configured to operate the drain side select gate switch transistors and the source side gate switch transistors to ground the drain side gates and ground the source side select gates while pre-charging the word line in the unselected block with the second WLSW transistor to the pre-charge voltage.

10. The apparatus of claim 1, wherein:

the pre-charge voltage remains on the second terminal of the second WLSW transistor while the program voltage is on the first terminal of the first WLSW transistor.

11. The apparatus of claim 10, wherein the one or more control circuits are configured to select a magnitude of the pre-charge voltage to reduce leakage current between the first terminal and the second terminal.

12. A method for operating non-volatile storage, the method comprising:

identifying a selected word line in a selected block in the non-volatile storage for programming, the selected word line connected to a set of NAND memory cells;

applying voltages to a first word line switch transistor to charge a first word line in an unselected block to a pre-charge voltage;

turning off the first word line switch transistor to float the first word line in the unselected block at the pre-charge voltage; and applying voltages to a second word line switch transistor adjacent to the first word line switch transistor to apply a program voltage to the selected word line in the selected block while the first word line in the unselected block floats at the pre-charge voltage.

13. The method of claim 12, further comprising:

maintaining substantially all other word lines in the unselected block at below the pre-charge voltage while applying the voltages to the first word line switch transistor to charge the first word line in the unselected block to the pre-charge voltage.

14. The method of claim 12, further comprising:

maintaining word lines in substantially all other unselected blocks at below the pre-charge voltage while applying the voltages to the first word line switch transistor to charge the first word line in the unselected block to the pre-charge voltage.

15. A non-volatile memory system, comprising:

a memory structure having a plurality of blocks, each block having NAND strings and word lines associated with the NAND strings;

a plurality of sets of word line switch (WLSW) transistors, each set of the WLSW transistors configured to provide voltages to the word lines in one of the blocks; and one or more control circuits in communication with the memory structure and the plurality of sets of WLSW transistors, the one or more control circuits configured to:

identify a selected word line in a selected block for programming, a first WLSW transistor in a first set of the WLSW transistors is configured to connect to and provide voltages to the selected word line;

identify a second WLSW transistor in a second set of the WLSW transistors that neighbors the first WLSW transistor;

apply voltages to the second WLSW transistor to charge an unselected word line in an unselected block to a pre-charge voltage;

apply voltages to the second WLSW transistor to turn off the second WLSW transistor after charging the unselected word line to the pre-charge voltage; and apply voltages to the first WLSW transistor to apply a program voltage to the selected word line while the unselected word line remains at the pre-charge voltage.

16. The non-volatile memory system of claim 15, wherein the one or more control circuits are further configured to:

apply voltages to remaining WLSW transistors in the second set of WLSW transistors to maintain the remaining word lines in the unselected block at a lower voltage than the pre-charge voltage while the unselected word line is at the pre-charge voltage.

17. The non-volatile memory system of claim 15, wherein the one or more control circuits are further configured to:

apply voltages to WLSW transistors in substantially all sets of WLSW transistors other than the second set to maintain word lines in the selected block and substantially all other unselected blocks at a lower voltage than the pre-charge voltage while charging the unselected word line in the unselected block to the pre-charge voltage.

18. The non-volatile memory system of claim 15, wherein the lower voltage than the pre-charge voltage is approximately 0V.

19. The non-volatile memory system of claim 15, wherein:

a first source of the first WLSW transistor is connected to the selected word line in the selected block;

a second source of the second WLSW transistor is connected to the unselected word line in the unselected block; and an insulator separates the first source from the second source.

20. The non-volatile memory system of claim 19, wherein:

the pre-charge voltage remains at the second source of the second WLSW transistor while the program voltage is at the first source of the first WLSW transistor; and the one or more control circuits are configured to select a magnitude of the pre-charge voltage to reduce leakage current between the first source and the second source.

* * * * *